(12) United States Patent
Shinohara et al.

(10) Patent No.: US 8,421,107 B2
(45) Date of Patent: Apr. 16, 2013

(54) GROUP-III NITRIDE SEMICONDUCTOR LIGHT EMITTING DEVICE AND PRODUCTION METHOD THEREOF, AND LAMP

(75) Inventors: Hironao Shinohara, Ichihara (JP); Hiromitsu Sakai, Chiba (JP)

(73) Assignee: Toyoda Gosei Co., Ltd., Aichi (JP)

( * ) Notice: Subject to any disclaimer, the term of this patent is extended or adjusted under 35 U.S.C. 154(b) by 42 days.

(21) Appl. No.: 12/999,850

(22) PCT Filed: Jun. 17, 2009

(86) PCT No.: PCT/JP2009/061000
§ 371 (c)(1), (2), (4) Date: Dec. 17, 2010

(87) PCT Pub. No.: WO2009/154215
PCT Pub. Date: Dec. 23, 2009

(65) Prior Publication Data
US 2011/0095327 A1    Apr. 28, 2011

(30) Foreign Application Priority Data
Jun. 20, 2008 (JP) ................................. 2008-162485

(51) Int. Cl.
*H01L 33/20* (2010.01)
*H01L 33/32* (2010.01)

(52) U.S. Cl.
USPC .............. 257/98; 257/E33.028; 257/E33.074; 438/29; 438/47

(58) Field of Classification Search ............ 257/88, 257/95, 98, E33.028, E33.074, E21.119; 438/29, 47
See application file for complete search history.

(56) References Cited

U.S. PATENT DOCUMENTS

| | | | |
|---|---|---|---|
| 7,683,386 B2 * | 3/2010 | Tanaka et al. .................. | 257/88 |
| 2006/0060866 A1 * | 3/2006 | Tezen ............................. | 257/79 |
| 2008/0073655 A1 | 3/2008 | Albrecht et al. | |
| 2009/0114933 A1 | 5/2009 | Osawa et al. | |

FOREIGN PATENT DOCUMENTS

| | | |
|---|---|---|
| JP | 2836687 B2 | 12/1998 |
| JP | 2002-280611 A | 9/2002 |
| JP | 2005-129896 A | 5/2005 |
| JP | 2007-194401 A | 8/2007 |
| JP | 2007-273659 A | 10/2007 |
| JP | 2008-072126 A | 3/2008 |
| JP | 2008-091942 A | 4/2008 |
| JP | 2008-115463 A | 5/2008 |
| JP | 2008-135463 A | 6/2008 |
| WO | 2007/119619 A1 | 10/2007 |

* cited by examiner

*Primary Examiner* — Teresa M Arroyo
*Assistant Examiner* — Whitney T Moore
(74) *Attorney, Agent, or Firm* — Sughrue Mion, PLLC

(57) ABSTRACT

A group III nitride semiconductor light emitting device including an LED structure formed on top of a single crystal, base layer (103) formed on top of a substrate (101) including a principal plane (10) having a flat surface (11) configured from a (0001) C plane, and a plurality of convex portions (12) including a surface (12c) non-parallel to the C plane having a width ($d_1$) of 0.05 to 1.5 μm and height (H) of 0.05 to 1 μm, the base layer is formed by causing a group III nitride semiconductor to grow epitaxially so as to cover the flat surface and convex portions, and the width ($d_1$) of the convex portions and top portion thickness ($H_2$) of the base layer at the positions of the top portions (12e) of the convex portions satisfy: $H_2 = kd_1$ (wherein $0.5 < k < 5$, and $H_2 = 0.5$ μm or more).

22 Claims, 4 Drawing Sheets

GROUP-III NITRIDE SEMICONDUCTOR LIGHT EMITTING DEVICE AND PRODUCTION METHOD THEREOF, AND LAMP

TECHNICAL FIELD

The present invention relates to a group III nitride semiconductor light emitting device that has a light emitting diode (LED) structure and a production method thereof, and also relates to a lamp.

Priority is claimed on Japanese Patent Application No. 2008-162485, filed Jun. 20, 2008, the content of which is incorporated herein by reference.

BACKGROUND ART

In recent years, a group III nitride semiconductor light emitting device has been attracting attention as a semiconductor material for light emitting devices which emit light of short wavelength. A group III nitride semiconductor is represented by the general formula $Al_xGa_yIn_zN$ ($0 \leq x \leq 1$, $0 \leq y \leq 1$, $0 \leq z \leq 1$ and $x+y+z=1$), and is formed on top of a substrate made of a sapphire single crystal, various kinds of oxides, or a group III-V compound, through a metal organic chemical vapor deposition method (MOCVD method), a molecular beam epitaxy method (MBE method), or the like.

In a typical light emitting device using a group III nitride semiconductor, an n-type semiconductor layer, a light emitting layer, and a p-type semiconductor layer are laminated in this order on top of a sapphire single crystal substrate. Since the sapphire substrate is an insulator, the device structure generally has a structure in which a positive electrode formed on top of the p-type semiconductor layer and a negative electrode formed on top of the n-type semiconductor layer are present on the same plane. Such a group III nitride semiconductor light emitting device has two types: a face up type in which a transparent electrode is used as a positive electrode to extract light from the p-type semiconductor side; and a flip chip type in which a highly reflective film of Ag or the like is used as a positive electrode to extract light from the sapphire substrate side.

The external quantum efficiency is used as an indicator for the output of such light emitting devices. When the external quantum efficiency is high, it is possible to say that the light emitting device has a high output. The external quantum efficiency is represented as the product of internal quantum efficiency and light extraction efficiency. The internal quantum efficiency refers to the proportion of energy converted into light in the light emitting layer amongst the energy of an electric current applied to the device. The light extraction efficiency refers to the proportion of light that can be extracted to the outside of the light emitting device amongst light generated in the light emitting layer. Accordingly, in order to improve the external quantum efficiency, the light extraction efficiency needs to be enhanced.

There are mainly two ways to improve the light extraction efficiency. One is a method to reduce the absorption of light by the electrode or the like formed on the light extraction surface. The other one is a method for reducing light confinement within the light emitting device occurring due to a difference in the refractive index between the light emitting device and an outside medium thereof.

In addition, when a transparent electrode is to be provided on top of a p-type semiconductor layer serving as the outermost layer so as to improve the light extraction efficiency of a light emitting device, a metallic transparent electrode made of Ni/Au or the like has been used conventionally. However, in recent years, a transparent electrode made of a translucent conductive oxide film of ITO or the like has been used instead.

One of the reasons why the transparent electrodes have been substituted from the metallic transparent electrodes made of Ni/Au or the like to the translucent conductive oxide films made of ITO or the like, as described above, is that the absorption of emitted light can be reduced by the use of translucent conductive oxide films.

In addition, as to the method for reducing light confinement within the light emitting device, a technique for forming an uneven pattern on the light extraction surface of the light emitting device can be used (for example, refer to Patent Document 1).

However, in the light emitting device in which an uneven pattern is formed on the light extraction surface by means of mechanical or chemical processing, the processing on the light extraction surface causes overloading on the semiconductor layer, leaving damage in the light emitting layer. In addition, in the light emitting device in which the semiconductor layer has been grown under such a condition that allows an uneven pattern to be formed on the light extraction surface, the crystallinity of the semiconductor layer is deteriorated, thereby making the light emitting layer defective. For this reason, when an uneven pattern is formed on the light extraction surface, although the light extraction efficiency improves, the internal quantum efficiency is lowered, causing a problem in that the light emission intensity cannot be increased.

Accordingly, instead of forming an uneven pattern on the light extraction surface, a method for forming an uneven pattern on the surface of the sapphire substrate to grow a group III nitride semiconductor layer thereon, has been proposed (for example, refer to Patent Document 2). Further, a method has been proposed for growing a GaN crystal on top of a substrate where curved convex portions have been formed as an uneven pattern on the substrate (for example, refer to Patent Document 3). Furthermore, a method has also been proposed for depositing a buffer layer on top of a translucent substrate, in which an uneven pattern has been formed, by a sputtering process using a sputtering apparatus (for example, refer to Patent Document 4).

According to such methods, the interface between the sapphire substrate and the group III nitride semiconductor layer becomes an uneven shape, and the difference in the refractive index between the sapphire substrate and the group III nitride semiconductor layer causes diffuse reflection of light in the interface, which can reduce the light confinement within the light emitting device and can improve the light extraction efficiency. In addition, due to the uneven shape formed on the surface of the sapphire substrate, it becomes possible to reduce crystal defects by taking advantage of crystals growing in the transverse direction and to improve the internal quantum efficiency.

PRIOR-ART DOCUMENT

Patent Document

[Patent Document 1] Japanese Patent Publication No. 2836687
[Patent Document 2] Japanese Unexamined Patent Application, First Publication No. 2002-280611
[Patent Document 3] Japanese Unexamined Patent Application, First Publication No. 2005-129896
[Patent Document 4] Japanese Unexamined Patent Application, First Publication No. 2007-273659

DISCLOSURE OF INVENTION

Problems to be Solved by the Invention

In those cases where an uneven pattern is formed on the surface of a sapphire substrate and a single crystal, group III nitride semiconductor is then epitaxially grown thereon, as in Patent Documents 2 and 3, an uneven pattern having a pitch of about 4 to 6 μm is typically formed on the substrate surface. However, when growing a group III nitride semiconductor on top of such a substrate, it is necessary to deposit an initial growth layer for planarizing the surface of a group III nitride semiconductor layer (base layer), which makes the process time longer. Moreover, if the surface of the group III nitride semiconductor layer is satisfactorily planarized, within the crystals grown and aggregated on the uneven pattern in the transverse direction, numerous dislocations that are caused prior to the aggregation remain. Since such dislocations are passed onto the respective layers such as the n-type semiconductor layer formed on top of the group III nitride semiconductor layer, generation of a leakage current or breakdowns originating from the dislocations readily occur, causing deteriorations in the electric characteristics, represented by the decline in the high voltage breakdown resistance, such as the electro-static discharge (ESD). In addition, when dislocations are passed onto the respective layers such as the n-type semiconductor layer formed on top of the group III nitride semiconductor layer, crystallinity of the device as a whole deteriorates, resulting in the deterioration of light emitting properties, which is a serious problem.

Further, in those cases where the group III nitride semiconductor layer (base layer) is formed thick by increasing the deposition time in order to planarize the surface of the group III nitride semiconductor layer, the extent of substrate warp increases due to the relationship with the thickness of the entire LED structure, which greatly reduces the yield in the later processes. Furthermore, since the process time for the sake of crystal growth becomes longer as described above, the productivity reduces considerably.

The present invention is made in view of the above problems and its object is to provide a group III nitride semiconductor light emitting device, which is excellent in terms of the internal quantum efficiency and light extraction efficiency, as well as the electric characteristics and production efficiency, and a production method thereof.

Furthermore, the present invention has an object of providing a lamp using the above-mentioned group III nitride semiconductor light emitting device which is excellent in terms of light emitting properties.

Means for Solving the Problems

The present inventors completed the present invention as a result of intensive and extensive studies in order to solve the above problems. That is, the present invention relates to the following aspects.

[1] A group III nitride semiconductor light emitting device including an LED structure formed on top of a single crystal, group III nitride semiconductor layer formed on top of a substrate, characterized in that the substrate includes a principal plane constituted of a flat surface configured from a (0001) C plane, and a plurality of convex portions including a surface non-parallel to the C plane, the convex portions have a base portion width $d_1$ of 0.05 to 1.5 μm and a height h of 0.05 to 1 μm, the group III nitride semiconductor layer is formed by causing a group III nitride semiconductor to grow epitaxially on top of the principal plane of the substrate so as to cover the flat surface and the convex portions, and the base portion width $d_1$ of the convex portions and the top portion thickness $H_2$ of the group III nitride semiconductor layer at the positions of the top portions of the convex portions have a relationship expressed by a formula: $H_2=kd_1$ (wherein $0.5<k<5$, and $H_2=0.5$ μm or more).

[2] The group III nitride semiconductor light emitting device according to the above aspect [1], characterized in that the convex portions are configured so that the height h is at least as large as ¼ of the base portion width $d_1$, and intervals $d_2$ between the convex portions adjacent to each other are 0.5 to 5 times as large as the base portion width $d_1$.

[3] The group III nitride semiconductor light emitting device according to the above aspect [1] or [2], characterized in that the convex portions have a shape in which an outer shape thereof gradually reduces in size towards the top portion.

[4] The group III nitride semiconductor light emitting device according to any one of the above aspects [1] to [3], characterized in that the convex portions have either a substantially circular cone shape or a substantially polygonal pyramid shape.

[5] The group III nitride semiconductor light emitting device according to any one of the above aspects [1] to [4], characterized in that the convex portions are composed of either an oxide or a nitride which is provided on top of the C plane of the substrate.

[6] The group III nitride semiconductor light emitting device according to the above aspect [5], characterized in that the convex portions are composed of any one of $SiO_2$, $Al_2O_3$, SiN and ZnO.

[7] The group III nitride semiconductor light emitting device according to any one of the above aspects [1] to [6], characterized in that the substrate is a sapphire substrate.

[8] The group III nitride semiconductor light emitting device according to any one of the above aspects [1] to [7], characterized in that the LED structure includes an n-type semiconductor layer, a light emitting layer and a p-type semiconductor layer in this order, each of which is constituted of a group III nitride semiconductor, on top of the principal plane of the substrate.

[9] The group III nitride semiconductor light emitting device according to any one of the above aspects [1] to [8], characterized in that a buffer layer constituted of polycrystal $Al_xGa_{1-x}N$ ($0 \leq x \leq 1$) and having a thickness of 0.01 to 0.5 μm is laminated on top of the principal plane of the substrate by a sputtering method, and the group III nitride semiconductor layer is laminated on top of the buffer layer.

[10] The group III nitride semiconductor light emitting device according to any one of the above aspects [1] to [8], characterized in that a buffer layer constituted of single crystal $Al_xGa_{1-x}N$ ($0 \leq x \leq 1$) and having a thickness of 0.01 to 0.5 μm is laminated on top of the principal plane of the substrate by a sputtering method, and the group III nitride semiconductor layer is laminated on top of the buffer layer.

[11] The group III nitride semiconductor light emitting device according to any one of the aspects [8] to [10], characterized in that the n-type semiconductor layer includes an n-type cladding layer, the p-type semiconductor layer includes a p-type cladding layer, and the n-type cladding layer and/or the p-type cladding layer includes at least a superlattice structure.

[12] A method for producing a group III nitride semiconductor light emitting device that forms a single crystal, group III nitride semiconductor layer on top of a substrate and forms an LED structure on top of the group III nitride semiconductor layer, the method characterized by including: a substrate processing step in which, by forming a plurality of convex portions having a base portion width $d_1$ of 0.05 to 1.5 μm and a height h of 0.05 to 1 μm on top of a flat surface configured from a (0001) C plane of the substrate, a principal plane constituted of the flat surface and the convex portions is formed on the substrate; an epitaxial step in which the group III nitride semiconductor layer is formed by causing the group III nitride semiconductor to grow epitaxially on top of the principal plane of the substrate so as to cover the flat surface and the convex portions, and by configuring so that the base portion width $d_1$ of the convex portions and the top portion thickness $H_2$ of the group III nitride semiconductor layer at the positions of the top portions of the convex portions have a relationship expressed by a formula: $H_2=kd_1$ (wherein $0.5<k<5$, and $H_2=0.5$ μm or more); and an LED lamination step in which the LED structure is formed by causing the group III nitride semiconductor to grow epitaxially in succession to the epitaxial step.

[13] The method for producing a group III nitride semiconductor light emitting device according to the above aspect [12], characterized in that the convex portions are formed in the substrate processing step so that a height h is at least as large as ¼ of the base portion width $d_1$, and intervals $d_2$ between the convex portions adjacent to each other are 0.5 to 5 times as large as the base portion width $d_1$.

[14] The method for producing a group III nitride semiconductor light emitting device according to the above aspect [12] or [13], characterized in that the convex portions are formed in the substrate processing step so as to have a shape in which an outer shape thereof gradually reduces in size towards the top portion.

[15] The method for producing a group III nitride semiconductor light emitting device according to any one of the above aspects [12] to [14], characterized in that the convex portions are formed in the substrate processing step so as to have either a substantially circular cone shape or a substantially polygonal pyramid shape.

[16] The method for producing a group III nitride semiconductor light emitting device according to any one of the above aspects [12] to [15], characterized in that the substrate is a sapphire substrate.

[17] The method for producing a group III nitride semiconductor light emitting device according to any one of the above aspects [12] to [16], characterized in that the convex portions are formed in the substrate processing step by forming a mask pattern on top of the (0001) C plane of the substrate using any one of a stepper exposure method, a nanoimprinting method, an electron beam (EB) exposure method, and a laser exposure method, followed by an etching of the substrate.

[18] The method for producing a group III nitride semiconductor light emitting device according to any one of the above aspects [12] to [16], characterized in that the convex portions are formed, on top of the (0001) C plane of the substrate, from either an oxide or a nitride.

[19] The method for producing a group III nitride semiconductor light emitting device according to the above aspect [18], characterized in that the convex portions are formed from any one of $SiO_2$, $Al_2O_3$, SiN and ZnO.

[20] The method for producing a group III nitride semiconductor light emitting device according to any one of the above aspects [12] to [19], characterized in that the LED structure is formed in the LED lamination step by laminating an n-type semiconductor layer, a light emitting layer and a p-type semiconductor layer in this order, each of which is constituted of a group III nitride semiconductor, on top of the principal plane of the substrate.

[21] The method for producing a group III nitride semiconductor light emitting device according to any one of the above aspects [12] to [20], characterized in that the group III nitride semiconductor layer is formed in the epitaxial step until a film thickness is achieved in which the top portion thickness $H_2$ of the group III nitride semiconductor layer satisfies a relationship, with the base portion width $d_1$ of the convex portions, expressed by a formula: $H_2=kd_1$ (wherein $0.5<k<5$, and $H_2=0.5$ μm or more), and an n-type semiconductor layer is then formed successively in the LED lamination step by starting a doping of an n-type impurity.

[22] The method for producing a group III nitride semiconductor light emitting device according to any one of the above aspects [12] to [21], characterized by further including, following the substrate processing step and prior to the epitaxial step, a buffer layer forming step in which a buffer layer constituted of polycrystal $Al_xGa_{1-x}N_x$ ($0 \leq x \leq 1$) and having a thickness of 0.01 to 0.5 μm is laminated on top of the principal plane of the substrate by a sputtering method.

[23] The method for producing a group III nitride semiconductor light emitting device according to any one of the above aspects [12] to [21], characterized by further including, following the substrate processing step and prior to the epitaxial step, a buffer layer forming step in which a buffer layer constituted of single crystal $Al_xGa_{1-x}N$ ($0 \leq x \leq 1$) and having a thickness of 0.01 to 0.5 μm is laminated on top of the principal plane of the substrate by a sputtering method.

[24] The method for producing a group III nitride semiconductor light emitting device according to any one of the above aspects [20] to [23], characterized in that in the LED lamination step, the n-type semiconductor layer is formed as a layer that includes an n-type cladding layer, the p-type semiconductor layer is formed as a layer that includes a p-type cladding layer, and the n-type cladding layer and/or the p-type cladding layer is formed as a layer that includes at least a superlattice structure.

[25] A group III nitride semiconductor light emitting device obtained by the production method according to any one of the above aspects [12] to [24].

[26] A lamp characterized by including the group III nitride semiconductor light emitting device according to any one of the above aspects [1] to [11] and [25].

Effects of the Invention

According to the group III nitride semiconductor light emitting device of the present invention, since it is constructed so that the substrate includes a principal plane constituted of a flat surface configured from a (0001) C plane, and a plurality of convex portions including a surface non-parallel to the C plane, the convex portions have a base portion width $d_1$ of 0.05 to 1.5 μm and a height h of 0.05 to 1 μm, the group III nitride semiconductor layer is formed by causing a group III nitride semiconductor to grow epitaxially on top of the principal plane of the substrate so as to cover the flat surface and the convex portions, and the base portion width $d_1$ of the convex portions and the top portion thickness $H_2$ of the group III nitride semiconductor layer at the positions of the top portions of the convex portions have a relationship expressed by the formula: $H_2=kd_1$ (wherein $0.5<k<5$, and $H_2=0.5$ μm or more), the surface of the group III nitride semiconductor layer can be excellently planarized and the dislocations can be suppressed. As a result, each of the layers constituting the LED structure formed on top of the group III nitride semiconductor layer becomes a layer in which dislocations are suppressed and the level of crystallinity is excellent. In addition, since the base portion width of the convex portions is small and the surface of the group III nitride semiconductor layer can be planarized rapidly, a group III nitride semiconductor light emitting device exhibiting superior electric characteristics as well as high internal quantum efficiency and excellent light emitting properties without causing generation of a leakage current or deteriorations in the ESD resistance can be obtained with a high yield. Further, since the time for growing the group III nitride semiconductor layer can be shortened, a group III nitride semiconductor light emitting device with high productivity can be obtained. Moreover, since the interface between the substrate and the group III nitride semiconductor layer is configured as a small uneven shape, the level of light confinement within the light emitting device can be reduced due to the diffuse reflection of light, thereby achieving a group III nitride semiconductor light emitting device with superior light extraction efficiency.

Furthermore, in the present invention, by adopting a layer constitution in which the n-type cladding layer and/or the p-type cladding layer includes a superlattice structure, a light emitting device having markedly improved output and superior electrical characteristics can be obtained.

In addition, according to the method for producing the group III nitride semiconductor light emitting device of the present invention, since it is a method that includes a substrate processing step in which, by forming a plurality of convex portions having a base portion width $d_1$ of 0.05 to 1.5 μm and a height h of 0.05 to 1 μm on top of a flat surface configured from a (0001) C plane of the substrate, a principal plane constituted of the flat surface and the convex portions is formed on the substrate; an epitaxial step in which the group III nitride semiconductor layer is formed by causing the group III nitride semiconductor to grow epitaxially on top of the principal plane of the substrate so as to cover the flat surface and the convex portions, and by configuring so that the base portion width $d_1$ of the convex portions and the top portion thickness $H_2$ of the group III nitride semiconductor layer at the positions of the top portions of the convex portions have a relationship expressed by the formula: $H_2=kd_1$ (wherein $0.5<k<5$, and $H_2=0.5$ μm or more); and an LED lamination step in which the LED structure is formed by causing the group III nitride semiconductor to grow epitaxially in succession to the epitaxial step, the surface of the group III nitride semiconductor layer can be excellently planarized and the dislocations can be suppressed. As a result, each of the layers constituting the LED structure can be formed on top of the group III nitride semiconductor layer in which dislocations are suppressed with excellent crystallinity. Further, since the base portion width of the convex portions is small and the surface of the group III nitride semiconductor layer can be planarized rapidly in the epitaxial step, a light emitting device with an excellent high voltage breakdown resistance, such as the ESD resistance, can be obtained. Therefore, a group III nitride semiconductor light emitting device exhibiting superior electric characteristics as well as high internal quantum efficiency and light extraction efficiency and also excellent light emitting properties without causing generation of a leakage current or deteriorations in the ESD resistance can be produced.

Moreover, since the lamp according to the present invention is one that uses the group III nitride semiconductor light emitting device of the present invention, it will have excellent light emitting properties.

BEST MODE FOR CARRYING OUT THE INVENTION

Embodiments of a group III nitride semiconductor light emitting device (hereafter, sometimes abbreviated as a "light emitting device") and a production method thereof, and a lamp according to the present invention are described below with appropriate reference to the drawings.

Figure 1:
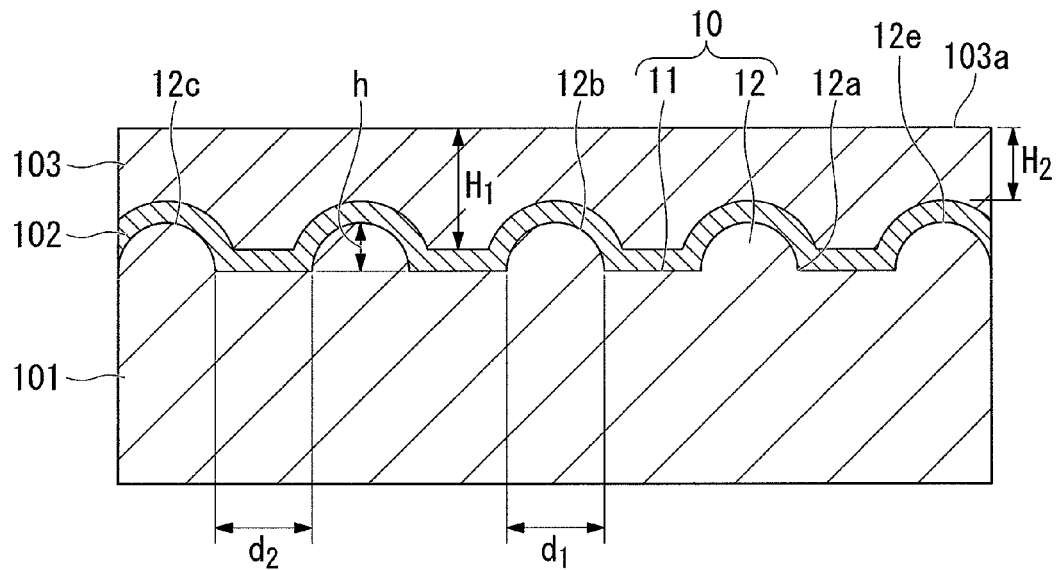
FIG. 1 is a diagram schematically describing an example of a group III nitride semiconductor light emitting device according to the present invention, and it is a cross sectional diagram showing a laminated structure in which a buffer layer and a base layer constituted of a single crystal, group III nitride semiconductor are formed on top of a principal plane of a substrate.
Figure 2:
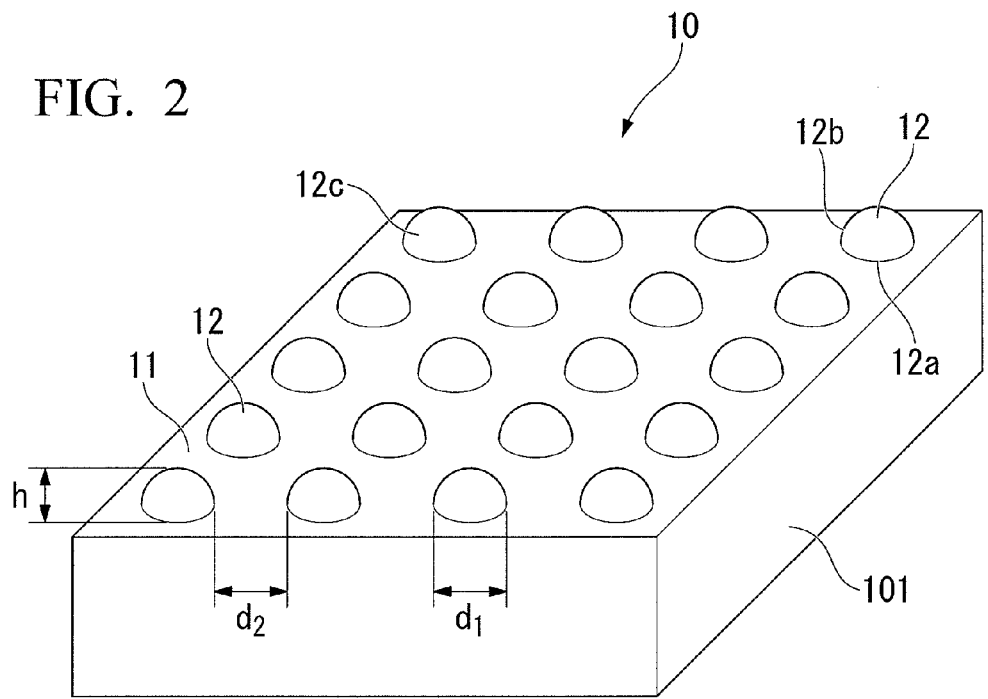
FIG. 2 is a diagram schematically describing an example of a group III nitride semiconductor light emitting device according to the present invention, and it is a perspective view showing a principal part in FIG. 1.
Figure 3:
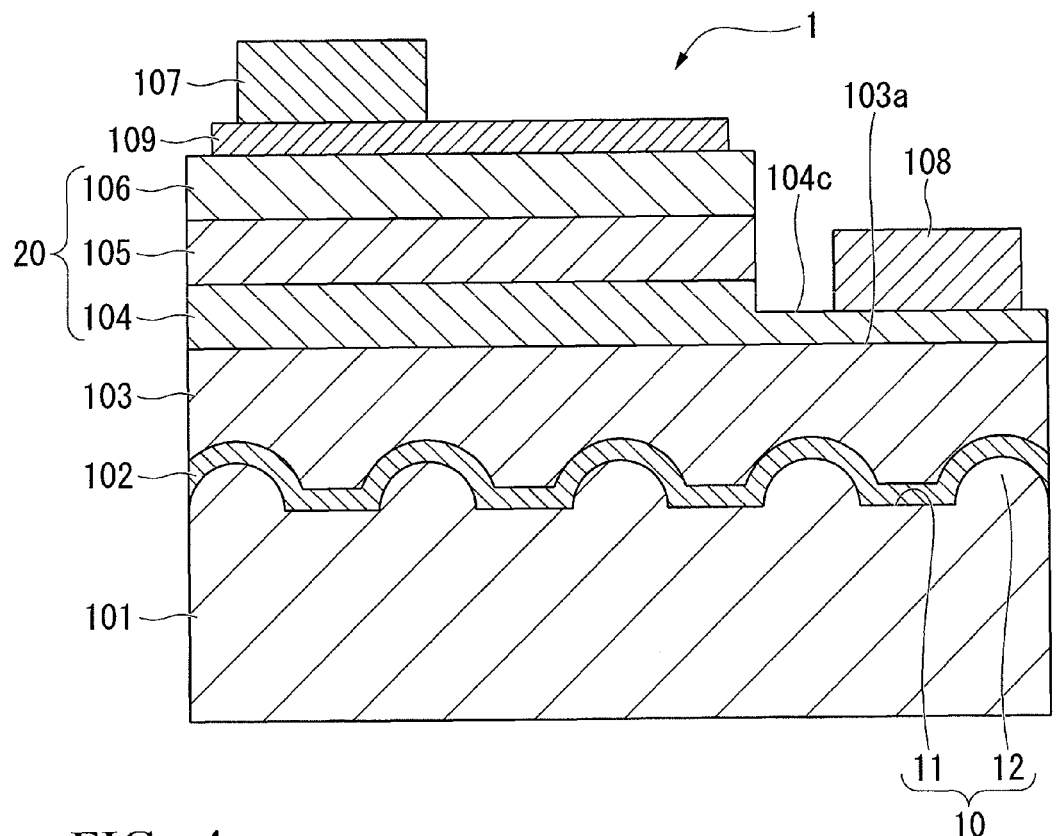
FIG. 3 is a diagram schematically describing an example of a group III nitride semiconductor light emitting device according to the present invention, and it is a cross sectional diagram showing a light emitting device in which an LED structure is formed on top of the laminated structure shown in FIG. 1.
Figure 4:
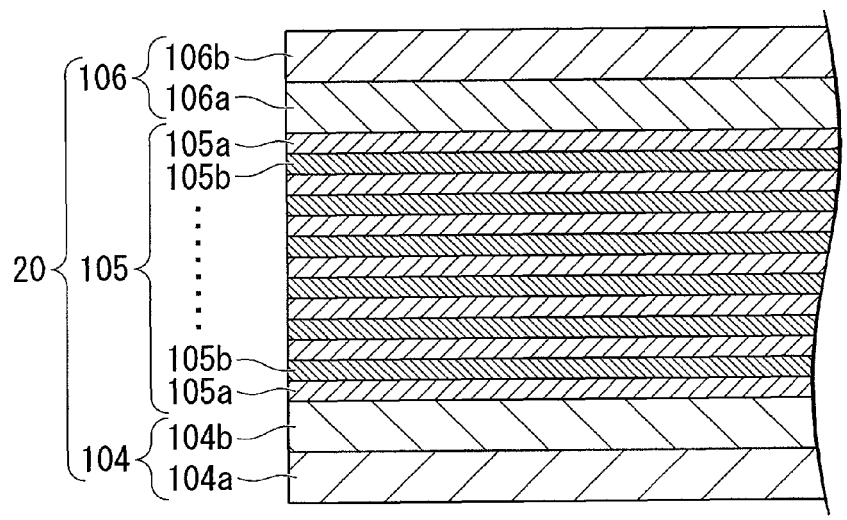
FIG. 4 is a diagram schematically describing an example of a group III nitride semiconductor light emitting device according to the present invention, and it is an enlarged cross sectional view showing a principal part in FIG. 3.

FIG. 1 is a diagram for explaining one principal part of a light emitting device 1 according to the present invention, and it is a cross sectional diagram showing a laminated structure in which a buffer layer 102 and a single crystal base layer (i.e., a group III nitride semiconductor layer) 103 are formed on top of a principal plane 10 of a substrate 101. FIG. 2 is a perspective view for explaining the substrate 101 shown in FIG. 1. In addition, FIG. 3 is a cross sectional diagram for explaining the light emitting device 1 in which an LED structure 20 is formed on top of the base layer (group III nitride semiconductor layer) 103 in the laminated structure shown in FIG. 1. In the diagram, the reference numeral 107 indicates a positive electrode bonding pad, and the reference numeral 108 indicates a negative electrode bonding pad. Further, FIG. 4 is a partial cross sectional view showing, among the light emitting device 1 shown in FIG. 3, an n-type semiconductor layer 104, a light emitting layer 105, and a p-type semiconductor layer 106.

[Group III Nitride Semiconductor Light Emitting Device]

As seen in an example shown in FIGS. 1 to 4, the light emitting device 1 according to the present invention is configured by forming the LED structure 20 on top of the single crystal base layer (group III nitride semiconductor layer) 103 formed on top of the substrate 101, and is mainly constituted of: the substrate 101 that includes a principal plane 10 constituted of a flat surface 11 configured from a (0001) C plane, and a plurality of convex portions 12 including a surface 12c non-parallel to the C plane, the convex portions have a base portion width $d_1$ of 0.05 to 1.5 μm and a height h of 0.05 to 1 μm; and the base layer 103 formed by causing a group III nitride semiconductor to grow epitaxially on top of the principal plane 10 of the substrate 101 so as to cover the flat surface 11 and the convex portions 12, and the base portion width $d_1$ of the convex portions 12 and the top portion thickness $H_2$ of the base layer 103 at the positions of the top portions 12e of the convex portions 12 have a relationship expressed by the formula: $H_2=kd_1$ (wherein $0.5<k<5$, and $H_2=0.5$ μm or more). In addition, in the example shown in the diagrams, a buffer layer 102 is provided on top of the substrate 101, and the base layer 103 is formed on top of this buffer layer 102.

As seen in an example shown in FIG. 3, the light emitting device 1 described in the present embodiment is a one-surface electrode-type device in which the buffer layer 102 and the LED structure (a group III nitride semiconductor layer) 20 formed of a group III nitride semiconductor containing Ga as the group III element are formed on top of the substrate 101 as described above. In addition, as shown in FIG. 3, the LED structure 20 included in the light emitting device 1 is formed by laminating each of the layers of the n-type semiconductor layer 104, the light emitting layer 105, and the p-type semiconductor layer 106 in that order.

The laminated structure of the light emitting device 1 will be described below in detail.

[Substrate]

(Substrate Material)

In the light emitting device 1 of the present embodiment, there are no particular limitations on the material used for the substrate 101 as described above, provided that group III nitride semiconductor crystals are able to undergo epitaxial growth on the surface of the substrate material, and any of a variety of materials may be selected for use. Specific examples of the substrate material include sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten and molybdenum.

In addition, of the above-mentioned substrate materials, the use of sapphire is particularly preferred, and an intermediate layer (i.e., a buffer layer) 102 is preferably formed on the C plane of the sapphire substrate.

Of the above-mentioned substrate materials, by using an oxide substrate or a metal substrate, which are known to undergo chemical degeneration upon contact with ammonia at high temperature, forming the buffer layer 102 without using ammonia, and then forming the base layer 103 described below via a method that uses ammonia, the buffer layer 102 also acts as a coating layer, and is therefore effective in preventing the chemical degeneration of the substrate 101.

Further, in those cases where the buffer layer 102 is formed by a sputtering method, the temperature of the substrate 101 can be suppressed to a low level, meaning that even in those cases where a substrate 101 formed of a material that undergoes decomposition at high temperature is used, each of the layers can be formed on top of the substrate 101 without damaging the substrate 101.

(Substrate Shape: Principal Plane Constituted of Flat Surface and Convex Portions)

As seen in an example shown in FIG. 2, a plurality of convex portions 12 are formed in the substrate 101 used in the present embodiment. In the principal plane 10 of the substrate 101, the portion where no convex portion 12 is formed constitutes the flat surface 11 configured from a (0001) C plane. Accordingly, as seen in the examples shown in FIGS. 1 and 2, the principal plane 10 of the substrate 101 is constituted of the flat surface 11 configured from a C plane and a plurality of convex portions 12.

As shown in FIGS. 1 and 2, the convex portions 12 are composed of surfaces 12c that are not parallel to the C plane, and the surfaces 12c have no (0001) C plane. The convex portions 12 shown in FIGS. 1 and 2 are configured so that base portions 12a thereof have a planar shape which is substantially circular with an outer shape that gradually reduces in size towards the top portions 12e and side planes 12b thereof have a bowl-like (hemispherical) shape that is curved towards the outside. In addition, as shown in FIGS. 1 and 2, the convex portions 12 are arranged in a grid form with regular intervals in terms of their planar arrangement.

Further, the convex portions 12 shown in FIGS. 1 and 2 are configured so as to have a base portion width $d_1$ within a range of 0.05 to 1.5 μm, and a height h within a range of 0.05 to 1 μm and at the same time, the height h is at least as large as ¼ of the base portion width $d_1$, and intervals $d_2$ between the convex portions 12 adjacent to each other are 0.5 to 5 times as large as the base portion width $d_1$. Here, the term "base portion width $d_1$ of the convex portions 12" refers to a length of the maximum width of the bottom (base portion 12a) of the convex part 12. Moreover, the term "interval $d_2$ between adjacent convex parts 12" refers to a distance between edges of base portions 12a of the nearest convex parts 12. The base portion width $d_1$ of the convex portions 12 described herein refers to the maximum length in the bottom of the convex portions 12 (that is, the base portion 12a). In addition, the intervals $d_2$ between the convex portions 12 adjacent to each other refers to the distance between edges of the base portions 12a of the convex portions 12 that are most closely arranged.

It is preferable that the intervals $d_2$ between the convex portions 12 adjacent to each other be 0.5 to 5 times as large as the base portion width $d_1$. If the intervals $d_2$ between the convex portions 12 are less than 0.5 times as large as the base portion width $d_1$, when epitaxially growing the base layer 103 that constitutes the n-type semiconductor layer 104 (semiconductor layer 30), it is difficult to promote the growth of crystals from the top of the flat surface 11 configured from a C plane and the convex portions 12 are difficult to be completely embedded within the base layer 103, and thus the flatness of the obtained surface 103a of the base layer 103 may become insufficient. Accordingly, when forming crystals of the semiconductor layer that constitutes an LED structure on top of the base layer 103 in which the convex portions 12 are embedded, numerous pits are naturally formed in these crystals which results in the impairment of the output, electrical properties, and the like of the group III nitride semiconductor light emitting device to be formed. On the other hand, if the intervals $d_2$ between the convex portions 12 exceed 5 times as large as the base portion width $d_1$, when forming a group III nitride semiconductor light emitting device using the substrate 101, the frequency of diffuse reflection of light at the interface between the substrate 101 and a group III nitride semiconductor layer formed on top of the substrate 101 will be reduced, which may lead to insufficient improvements in terms of light extraction efficiency.

It is preferable that the base portion width $d_1$ be within a range of 0.05 to 1.5 μm. If the base portion width $d_1$ is less than 0.05 μm, when forming a group III nitride semiconductor light emitting device using the substrate 101, the effect to reflect light diffusely may not be attained sufficiently. On the other hand, if the base portion width $d_1$ exceeds 1.5 μm, when epitaxially growing the base layer 103 epitaxially while embedding the convex portions 12 therein, portions that are not planarized will be generated, or the time for growing the layer increases, which reduces the productivity.

In addition, by configuring the base portion width $d_1$ smaller in size within the above-mentioned range, the effect of further improving the light emission output of the light emitting device can be attained.

It is preferable that the height h of the convex portions 12 be within a range of 0.05 to 1 μm. If the height h of the convex portions 12 is less than 0.05 μm, when forming a group III nitride semiconductor light emitting device using the substrate 101, the effect to reflect light diffusely may not be attained sufficiently. On the other hand, if the height h of the convex portions 12 exceeds 1 μm, it will be difficult to epitaxially grow the base layer 103 while embedding the convex portions 12 therein, and the flatness of the obtained surface 103a of the base layer 103 may become insufficient.

In addition, it is preferable that the height h of the convex portions 12 be at least as large as ¼ of the base portion width $d_1$. If the height h of the convex portions 12 is less than ¼ of the base portion width $d_1$, when forming a group III nitride semiconductor light emitting device using the substrate 101, the effect to reflect light diffusely or the effect to improve light extraction efficiency may not be attained sufficiently.

Note that the shape of the convex portions 12 is not limited to the examples shown in FIGS. 1 and 2, and any shape may be adopted as long as the convex portions 12 are composed of a surface that is not parallel to the C plane. For example, a shape may be adopted so that base portions have a planar shape which is substantially polygonal with an outer shape that gradually reduces in size towards the top portion and side planes 12 have a shape that is curved towards the outside. Alternatively, a shape may be adopted so that side planes have a substantially circular cone shape or a substantially polygonal pyramid shape which is formed of a slope with an outer shape that gradually reduces in size towards the top portion. In addition, a shape may also be adopted, in which an angle of inclination of the side planes is changed in 2 stages.

Moreover, the planar arrangement of the convex portions 12 is not limited to the examples shown in FIGS. 1 and 2 either, and they may be arranged with regular intervals or may not be arranged with regular intervals. Further, in terms of the planar arrangement, the convex portions 12 may be arranged in a quadrangular arrangement, a triangular arrangement, or a random arrangement.

It should be noted that in the present embodiment, although the convex portions 12 provided on top of the substrate 101 can be formed by etching the substrate 101 through a production method to be described later in detail, the method is not limited thereto. For example, it is also possible to form the convex portions on top of the substrate by depositing a material which constitutes the convex portions and is different from the substrate material onto the C plane of the substrate 101. As a method for depositing a different material that constitutes the convex portions on a substrate, for example, a sputtering method, a vapor deposition method, a CVD method, or the like can be used. In addition, in terms of the material that constitutes the convex portions, it is preferable to use a material having a refractive index which is almost equal to that of the substrate material, such as an oxide or a nitride. For example, when a substrate is a sapphire substrate, $SiO_2$, $Al_2O_3$, SiN, ZnO or the like can be used as a material for forming the convex portions.

In the present invention, by configuring the substrate 101 as described above to include the principal plane constituted of the flat surface 11 and the convex portions 12, the interface between the substrate 101 and the base layer 103 to be described later in detail is configured as an uneven shape via the buffer layer 102, and thus the level of light confinement within the light emitting device can be reduced due to the diffuse reflection of light, thereby achieving the light emitting device 1 with superior light extraction efficiency. Moreover, by configuring the substrate 101 as described above, crystallinity of the buffer layer 102 and the base layer 103 improves due to the action to be described later in detail, and thus crystallinity of the LED structure 20 to be formed thereon also becomes superior. Therefore, it becomes possible to provide the light emitting device 1 excellent in terms of the internal quantum efficiency and light extraction efficiency and exhibiting high light emission output as well as superior electric characteristics while suppressing the generation of a leakage current.

[Buffer Layer]

In the present invention, it is preferable to form the buffer layer 102 on top of the principal plane 10 of the substrate 101 and to form the base layer 103 thereon, which is described later.

The buffer layer 102 is laminated on top of the substrate so as to have a composition of $Al_xGa_{1-x}N$ ($0 \leq x \leq 1$) and can be formed, for example, through a reactive sputtering method in which a gas containing a group V element and a metallic material are activated with plasma and allowed to react. A film formed by the method employing a metallic source that is made into plasma, like the layer formed in the present embodiment, has an effect in that a favorable orientation can be readily attained.

The buffer layer 102 has a function to relax any difference in the lattice constant between the substrate 101 and the base layer 103 and to facilitate the formation of a single crystal layer oriented along the C-axis on the C plane of the substrate 101.

Accordingly, by laminating a single crystal, group III nitride semiconductor layer (i.e., the base layer 103) on top of the buffer layer 102, the base layer 103 with more superior crystallinity can be formed. Note that in the present embodiment, although it is most preferable to form the buffer layer 102 between the substrate 101 and the base layer 103, it can also be configured so as to omit the buffer layer.

(Composition)

In the present embodiment, it is preferable that the buffer layer 102 has a composition that includes Al, and any material can be used as long as it is a group III nitride compound represented by the general formula $Al_xGa_{1-x}N$ ($1 \geq X \geq 0$). The buffer layer 102 having a composition that includes at least 50% of Al is more preferable. Moreover, it is most preferable that the buffer layer 102 be constituted of AlN.

(Crystal Structure)

The crystals of the group III nitride that constitute the buffer layer 102 has a crystal structure of a hexagonal system, and can be formed as a single crystal film by controlling the film forming conditions. In addition, by controlling the above-mentioned film forming conditions, the crystals of the group III nitride can also be formed as columnar crystals (polycrystals) composed of a texture based on hexagonal columns. Here, the term "columnar crystals" described herein refers to crystals in which a crystal grain boundary is formed between adjacent crystal grains, and the crystals themselves adopt a columnar shape in a longitudinal cross-section.

It is preferable from the viewpoint of a buffering function that the buffer layer 102 have a single crystal structure. As described above, the crystals of the group III nitride have a hexagonal crystal structure and form a texture based on hexagonal columns By controlling the film forming conditions and the like, the crystals of the group III nitride can be grown not only in the upper direction, but also across the in-plane direction. When this type of buffer layer 102 having a single crystal structure is formed on top of the substrate 101, the buffering function of the buffer layer 102 is particularly effective, and as a result, the group III nitride semiconductor layer formed on top of the buffer layer 102 becomes a crystalline film having excellent orientation and crystallinity.

(Film Thickness)

The film thickness of the buffer layer 102 is preferably within a range of 0.01 to 0.5 μm. By making the film thickness of the buffer layer 102 within the above range, the buffer layer 102 can be obtained which has a favorable orientation and which effectively functions as a coating layer when forming each of the layers composed of a group III nitride semiconductor on top of the buffer layer 102. If the film thickness of the buffer layer 102 is less than 0.01 μm, there is a possibility that the abovementioned function of the layer as the coating layer may not be favorable, and the buffering function to relax the difference in the lattice constant between the substrate 101 and the base layer 103 may become insufficient. On the other hand, if the buffer layer 102 is formed with a film thickness exceeding 0.5 μm, it is possible that its film forming process will require a longer time, thereby lowering its productivity, although its buffering function or the function as a coating layer is not adversely affected. In addition, the film thickness of the buffer layer 102 is more preferably within a range of 0.02 to 0.1 μm.

[Group III Nitride Semiconductor Layer (Base Layer)]

The base layer (group III nitride semiconductor layer) 103 included in the light emitting device 1 of the present invention is constituted of a group III nitride semiconductor, and can be formed, for example, by being laminated on top of the buffer layer 102 through a known metal organic chemical vapor deposition (MOCVD) method. In addition, as mentioned above, the base layer 103 described in the present embodiment is formed by epitaxially growing a group III nitride semiconductor on top of the principal plane 10 of the substrate 101 via the buffer layer 102 so as to cover the flat surface 11 and the convex portions 12.

(Base Layer Material)

In terms of the material for the base layer 103, for example, $Al_xGa_yIn_zN$ ($0 \leq x \leq 1$, $0 \leq y \leq 1$, $0 \leq z \leq 1$, and $x+y+z=1$) layer can be used. However, it is more preferable to employ an $Al_yGa_{1-y}N$ layer ($0 \leq y \leq 1$, preferably $0 \leq y \leq 0.5$, and more preferably $0 \leq y \leq 0.1$) in view of forming the base layer 103 with favorable crystallinity.

In addition, although a different material from that of the buffer layer 102 as mentioned above may be used as the material for the base layer 103, the same material as that of the buffer layer 102 may also be used.

If necessary, the base layer 103 may be doped with an n-type impurity, provided the doping quantity is within a range from $1 \times 10^{17}$ to $1 \times 10^{19}$/cm$^3$, but an undoped layer ($<1 \times 10^{17}$/cm$^3$) may also be formed, and an undoped layer is preferred in terms of maintaining favorable crystallinity.

In those cases where the substrate 101 is electrically conductive, by doping the base layer 103 with a dopant to make the layer electrically conductive, electrodes can be formed on the top and bottom of the light emitting device. On the other hand, in those cases where an insulating material is used as the substrate 101, because a chip structure must be adopted in which both the positive electrode and the negative electrode are provided on the same surface of the light emitting device, forming the base layer 103 from an undoped crystal yields superior crystallinity and is consequently preferred.

There are no particular limitations on the n-type impurity to be doped in the base layer 103, and suitable examples include Si, Ge and Sn, and of these, Si and Ge are preferred.

(Thickness of Base Layer)

As shown in FIG. 1, the base layer 103 included in the light emitting device of the present invention is configured so that the base portion width $d_1$ of the convex portions 12 constituting the principal plane 10 of the substrate 101 and the top portion thickness $H_2$ of the base layer 103 at the positions of the top portions 12e of the convex portions 12 have a relationship expressed by the formula: $H_2 = kd_1$ (wherein $0.5 < k < 5$, and $H_2 = 0.5$ μm or more). In the present invention, the base portion width $d_1$ of the substrate is within a range of 0.05 to 1.5 μm, and it is preferable that the top portion thickness $H_2$ of the base layer 103 be within the same range while specifying the relationship expressed by the formula: $H_2$ (top portion thickness) $= kd_1$ (base portion width) (wherein $0.5 < k < 5$, and $H_2 = 0.5$ μm or more).

In those cases where the convex portions 12 are formed on the principal plane 10 of the substrate 101 to provide an uneven shape, and then epitaxially growing the base layer 103 constituted of a single crystal, group III nitride semiconductor on top of the principal plane 10, as seen in the example shown in FIG. 1, if the top portion thickness $H_2$ is too thin, the surface of the base layer may not be planarized satisfactorily. In such cases, when the group III nitride semiconductor crystals grown from the flat surface 11 constituted of the (0001) C plane grow in the transverse direction on the uneven shape of the principal plane and are aggregated on the convex portions, numerous dislocations developed prior to the aggregation remain. Since such dislocations are passed onto the n-type semiconductor layer that constitutes the LED structure and other respective layers, deteriorations in the electric characteristics, such as the generation of a leakage current and the decline in the ESD resistance occur. In addition, when dislocations are passed onto the respective layers such as the n-type semiconductor layer formed on top of the base layer, crystallinity of the device as a whole deteriorates, resulting in the deterioration of light emitting properties, which is a serious problem.

Moreover, when the base layer is formed into a thick layer by increasing the deposition time more than necessary in order to planarize the surface of the base layer, portions with a reduced level of flatness will be generated, or the time for growing the layer increases, which reduces the productivity. Furthermore, the high voltage breakdown resistance, such as the electro-static discharge (ESD) resistance deteriorates, which further impairs the electric characteristics.

In the present invention, by specifying such that the base portion width $d_1$ of the convex portions 12 of the substrate 101 and the top portion thickness $H_2$ of the base layer 103 have a relationship expressed by the formula: $H_2$ (top portion thickness) $= kd_1$ (base portion width) (wherein $0.5 < k < 5$, and $H_2 = 0.5$ μm or more), the top portion thickness $H_2$ of the base layer 103 can be made with a sufficient thickness with respect to the base portion width $d_1$ of the convex portions 12. As a result, the surface 103a of the base layer 103 is planarized in a favorable manner. In addition, since the extent of dislocations remaining in the aggregated portion of the group III nitride semiconductor crystals on top of the convex portions 12 is reduced, each of the layers constituting the LED structure 20 and formed on top of the base layer 103 is formed as a layer with a favorable level of crystallinity, in which the occurrence of crystal defects such as dislocations is suppressed. Therefore, the light emitting device 1 exhibiting superior electric characteristics as well as high internal quantum efficiency and also excellent light emitting properties without causing generation of a leakage current or deteriorations in the ESD resistance can be produced.

Moreover, since the interface between the substrate 101 and the base layer 103 is configured as an uneven shape, the level of light confinement within the light emitting device can be reduced due to the diffuse reflection of light, thereby achieving a light emitting device with superior light extraction efficiency.

It should be noted that if the top portion thickness $H_2$ of the base layer 103 and the maximum thickness $H_1$, which is a thickness of the base layer 103 in the position of the flat surface 11 of the substrate 101, are too thick, as mentioned above, the process time increases and sufficient film thickness for the n-type semiconductor layer 104 formed thereon cannot be obtained.

In the present invention, in view of achieving both the above-mentioned effects and high productivity, it is preferable to specify the base portion width $d_1$ of the convex portions 12 formed on the substrate 101 within the above-mentioned range, and also to specify the base portion width $d_1$ of the convex portions 12 and the top portion thickness $H_2$ of the base layer 103 so as to satisfy the relationship expressed by the formula: $H_2=kd_1$ (wherein $0.5<k<5$, and $H_2=0.5$ µm or more) and to make the maximum thickness $H_1$ of the base layer 103 within a range from 1.5 to 4.5 µm.

In the present invention, as described later in detail in the explanation for the production method, by forming the base layer 103 until the above-mentioned film thicknesses (i.e., the maximum thickness $H_1$ and the top portion thickness $H_2$) are achieved and then successively starting the doping of n-type impurities, the n-type semiconductor layer 104 can be formed efficiently thereon with a sufficient film thickness.

Moreover, the maximum thickness $H_1$ of the base layer 103 is more preferably at least twice the height h of the convex portions 12 of the substrate 101, from the viewpoint that the flatness of the surface 103a can be further improved. If the maximum thickness $H_1$ of the base layer 103 is less than twice the height h of the convex portions 12, the flatness of the surface 103a of the base layer 103 grown so as to cover the convex portions 12 may become insufficient.

[LED Structure]

The LED structure 20 includes the n-type semiconductor layer 104, the light emitting layer 105, and the p-type semiconductor layer 106, each of which is made of a group III nitride semiconductor. Each of the layers which constitutes such LED structure 20 can be obtained with even higher crystallinity if formed by the MOCVD method.

[n-Type Semiconductor Layer]

The n-type semiconductor layer 14 is typically composed of an n-type contact layer 104a and an n-type cladding layer 104b. The n-type contact layer 104a may also serve as the n-type cladding layer 104b.

The n-type contact layer 104a is a layer for providing a negative electrode. The n-type contact layer 104a is preferably constituted of an $Al_xGa_{1-x}N$ layer ($0 \leq x<1$, more preferably $0 \leq x \leq 0.5$, and even more preferably $0 \leq x \leq 0.1$). In addition, the n-type contact layer 104a is preferably doped with an n-type impurity. The concentration of the n-type impurity is preferably within a range from $1 \times 10^{17}$ to $1 \times 10^{20}/cm^3$, and preferably from $1 \times 10^{18}$ to $1 \times 10^{19}/cm^3$, in terms of maintenance of excellent ohmic contact with the negative electrode. There are no particular limitations on the n-type impurity, and suitable examples include Si, Ge and Sn, and of these, Si and Ge are preferred.

The thickness of the n-type contact layer 104a is preferably within a range of 0.5 to 5 µm, and more preferably within a range of 1 to 3 µm. If the thickness of the n-type contact layer 104a is within the above-mentioned range, a favorable level of crystallinity of the semiconductor can be maintained.

It is preferable that the n-type cladding layer 104b be provided between the n-type contact layer 104a and the light emitting layer 105. The n-type cladding layer 104b is a layer which performs carrier injection into and carrier confinement within the light emitting layer 105. The n-type cladding layer 104b can be formed from AlGaN, GaN, GaInN, or the like. In addition, the n-type cladding layer 104b may also adopt a superlattice structure having a heterojunction, or multiple laminations, of these structures. It goes without saying that when forming the n-cladding layer 104b with GaInN, it is desirable that its bandgap is larger than that of GaInN in the light emitting layer 15.

In the present invention, as described later in detail in the explanation for the production method, since it is configured so that the n-type contact layer 104a doped with n-type impurities is formed on top of the undoped base layer 103 having the above-mentioned construction, by forming the base layer 103 until the above-mentioned top portion thickness $H_2$ is achieved and then successively starting the doping of n-type impurities, the n-type semiconductor layer 104 can be formed without lowering the production efficiency. As a result, the thickness for each of the n-type contact layer 104a and the n-type cladding layer 104b can be secured, and the n-type semiconductor layer 104 can be formed with a sufficient film thickness, thereby achieving a light emitting device with excellent electric characteristics such as the ESD resistance.

Although the film thickness of the n-type cladding layer 104b is not particularly limited, it is preferably within the range of 0.005 to 0.5 µm and more preferably within the range of 0.005 to 0.1 µm. The n-type dopant concentration in the n-type cladding layer 104b is preferably within the range of $1 \times 10^{17}$ to $1 \times 10^{20}/cm^3$ and more preferably within the range of $1 \times 10^{18}$ to $1 \times 10^{19}/cm^3$. It is preferable that the dopant concentration be within this range for maintaining satisfactory crystallinity and for reducing the operating voltage of the device.

It is preferable that the total film thickness of the n-type semiconductor layer 104 as a whole combining both the n-type contact layer 104a and the n-type cladding layer 104b be within a range from 1 to 4 µm.

In general, the total film thickness of the base layer 103 and the n-type semiconductor layer 104 combined is about 10 µm. However, in the present invention, by specifying the thickness of the base layer 103 as mentioned above, it becomes possible to make the thickness of the n-type semiconductor layer 104 thicker, by about 1.7 µm. As described above, by securing a sufficient film thickness for the n-type semiconductor layer 104, the level of sheet resistance in this layer is lowered, the high voltage resistance characteristics such as the ESD resistance are improved, and the extent of warpage of the wafer is reduced, and thus the productivity when splitting into LED chips can be enhanced.

Note that in those cases where the n-type cladding layer 104b is made into a layer containing a superlattice structure, although a detailed illustration is omitted, the layer may include a laminated structure composed of an n-side first layer formed of a group III nitride semiconductor having a film thickness of not more than 100 angstroms, and an n-side second layer having a different composition from that of the n-side first layer and formed of a group III nitride semiconductor having a film thickness of not more than 100 angstroms. In addition, the n-type cladding layer 104b may also be a layer including a structure in which the n-side first layer and the n-side second layer are laminated repeatedly in an alternating arrangement. Moreover, it is preferable to adopt a configuration such that any one of the n-side first layer and the n-side second layer is brought into contact with the active layer (i.e., the light emitting layer 105).

The above-mentioned n-side first layer and n-side second layer can be formed, for example, using an AlGaN system containing Al (hereafter also referred to as simply "AlGaN"), a GaInN system containing In (hereafter also referred to as simply "GaInN"), or GaN. In addition, the n-side first layer and the n-side second layer may also be a GaInN/GaN alternating structure, an AlGaN/GaN alternating structure, a GaInN/AlGaN alternating structure, a GaInN/GaInN alternating structure having a different composition for each layer (in the present invention, the expression "different composition" refers to a different compositional ratio for each of the component elements, this definition also applies below), or an AlGaN/AlGaN alternating structure having a different composition for each layer. In the present invention, the n-side first layer and the n-side second layer preferably have either a GaInN/GaN alternating structure, or a GaInN/GaInN alternating structure having a different composition for each layer.

The superlattice layers of the n-side first layer and the n-side second layer are preferably not more than 60 angstroms in each case, are more preferably 40 angstroms or less, and are most preferably within a range from 10 to 40 angstroms. If the film thickness of the n-side first layer and n-side second layer that form the superlattice layer exceeds 100 angstroms, then crystal defects become more prevalent, which is undesirable.

The n-side first layer and the n-side second layer may be doped structures, or may be a combination of a doped structure and an undoped structure. As the doping impurity, any of the conventional impurities used for doping the above material compositions can be used without any particular limitations. For example, in those cases where a GaInN/GaN alternating structure or a GaInN/GaInN alternating structure having a different composition for each layer is used as the n-type cladding layer, Si is preferred as the impurity. In addition, the above-mentioned n-type superlattice multilayer film may be prepared with doping switched appropriately ON and OFF, even if the composition such as GaInN, AlGaN or GaN is the same.

As described above, by adopting a layer constitution in which the n-type cladding layer 104b includes a superlattice structure, the light emitting device 1 having markedly improved emission output and superior electrical characteristics can be obtained.

[Light Emitting Layer]

As the light emitting layer 105 that is laminated on top of the n-type semiconductor layer 104, the light emitting layer 105 may adopt a single quantum well structure, a multiple quantum well structure, or the like. As a well layer having a quantum well structure as shown in FIG. 4, a group III nitride semiconductor having a composition of $Ga_{1-y}In_yN$ (0<y<0.4) is typically used in those cases where a well layer for achieving blue light emission is configured, whereas those having an increased indium composition are used when a well layer for achieving green light emission is configured.

In the case of the light emitting layer 105 having a multiple quantum well structure as in the present invention, it is preferable to configure so that the above-mentioned $Ga_{1-y}In_yN$ layer is prepared as a well layer 105b and a layer $Al_zGa_{1-z}N$ ($0 \leq z < 0.3$) exhibiting a larger band gap energy than that of the well layer 105b is prepared as a barrier layer 105a.

In addition, the well layer 105b and the barrier layer 105a may be or may not be doped with an impurity, depending on the design.

Further, the thickness of the well layer 105b can be set to a degree that can achieve the quantum effect, for example from 1 to 10 nm, and preferably from 2 to 6 nm, in view of light emission output.

[p-Type Semiconductor Layer]

The p-type semiconductor layer 106 is typically composed of a p-type cladding layer 106a and a p-type contact layer 106b. In addition, the p-type contact layer 106b may also function as the p-type cladding layer 106a.

The p-type cladding layer 106a is a layer which performs carrier confinement within and carrier injection into the light emitting layer 105. Although there are no particular limitations on the composition of the p-type cladding layer 106a, provided the composition exhibits a larger band gap energy than that of the light emitting layer 105 and the layer is capable of confining a carrier in the light emitting layer 105, examples of preferred layers include those formed of $Al_xGa_{1-x}N$ (wherein $0 < x \leq 0.4$). A p-type cladding layer 106a composed of this type of AlGaN is preferred in terms of confining a carrier in the light emitting layer 105. There are no particular limitations on the film thickness of the p-type cladding layer 106a. However, it is preferably within a range of 1 to 400 nm, and more preferably within a range of 5 to 100 nm. The p-type dopant concentration within the p-type cladding layer 106a is preferably within a range from $1 \times 10^{18}$ to $1 \times 10^{21}/cm^{-3}$, and more preferably from $1 \times 10^{19}$ to $1 \times 10^{20}/cm^3$. If the p-type dopant concentration is within the above-mentioned range, an excellent p-type crystal can be obtained without deteriorating the crystallinity.

In addition, the p-type cladding layer 106a may also be formed as a superlattice structure in which a plurality of layers are laminated.

It should be noted that in those cases where the p-type cladding layer 106a is made into a layer containing a superlattice structure, although not shown in detail in the drawings, the layer may include a laminated structure composed of a p-side first layer formed of a group III nitride semiconductor having a film thickness of not more than 100 angstroms, and a p-side second layer having a different composition from that of the p-side first layer and formed of a group III nitride semiconductor having a film thickness of not more than 100 angstroms. In addition, the p-type cladding layer 106a may also include a structure in which the p-side first layer and the p-side second layer are laminated repeatedly in an alternating arrangement.

The above-mentioned p-side first layer and p-side second layer may be formed, for example, from any one of AlGaN, GaInN and GaN, with a different composition for each layer. In addition, the p-side first layer and p-side second layer may also be formed as a GaInN/GaN alternating structure, an AlGaN/GaN alternating structure, or a GaInN/AlGaN alternating structure. In the present invention, the p-side first layer and the p-side second layer preferably have either an AlGaN/AlGaN structure, or an AlGaN/GaN alternating structure.

The superlattice layers of the p-side first layer and the p-side second layer are preferably not more than 60 angstroms in each case, are more preferably 40 angstroms or less, and are most preferably within a range from 10 to 40 angstroms. If the film thickness of the p-side first layer and p-side second layer that form the superlattice layer exceed 100 angstroms, then the layer tends to contain many crystal defects, which is undesirable.

The p-side first layer and the p-side second layer may be doped structures, or may be a combination of a doped structure and an undoped structure. As the doping impurity, any of the conventional impurities used for doping the above material compositions can be used without any particular limitations. For example, in those cases where an AlGaN/GaN alternating structure or an AlGaN/AlGaN alternating structure having a different composition for each layer is used as the p-type cladding layer, Mg is preferred as the impurity. In addition, the above-mentioned p-type superlattice multilayer film may be prepared with doping switched appropriately ON and OFF, even if the composition such as GaInN, AlGaN or GaN is the same.

As described above, by adopting a layer constitution in which the p-type cladding layer 106a includes a superlattice structure, the light emitting device 1 having markedly improved emission output and superior electrical characteristics can be obtained.

The p-type contact layer 106b is a layer for providing a positive electrode. The p-type contact layer 106b is preferably constituted of an $Al_xGa_{1-x}N$ layer ($0 \leq x \leq 0.4$). An Al composition within the above range is preferred in terms of maintaining a favorable level of crystallinity, and achieving a favorable ohmic contact with a p-ohmic electrode. Incorporating a p-type impurity (dopant) at a concentration of $1 \times 10^{18}$ to $1 \times 10^{21}/cm^3$, and more preferably within a range from $5 \times 10^{19}$ to $5 \times 10^{20}/cm^3$, is preferred in terms of maintaining a favorable ohmic contact, preventing the occurrence of cracking, and maintaining a favorable level of crystallinity. There are no particular limitations on the p-type impurity, although Mg is preferred. Although the film thickness of the p-type contact layer 106b is not particularly limited, it is preferably be within the range of 0.01 to 0.5 μm and more preferably 0.05 to 0.2 μm. It is preferable that the film thickness of the p-type contact layer 106b be within this range from a viewpoint of light emission output.

The LED structure 20 included in the light emitting device 1 according to the present invention is formed on the surface 103a of the base layer 103 with a reduced level of dislocations and a favorable level of crystallinity, as mentioned above. Firstly, in the present invention, it is configured so that the substrate 101 includes the principal plane 10 constituted of the flat surface 11 and the convex portions 12 have a base portion width $d_1$ within a range of 0.05 to 1.5 μm and a height h within a range of 0.05 to 1 μm. Then, the base layer 103 is configured with a layer formed by epitaxially growing a group III nitride semiconductor on top of the principal plane 10 of the substrate 101 so as to cover the flat surface 11 and the convex portions 12. In such cases, if the top portion thickness $H_2$ of the base layer 103 is too thin, the base layer surface may not be planarized satisfactorily. However, in the present invention, by specifying such that the base portion width $d_1$ of the convex portions 12 and the top portion thickness $H_2$ of the base layer 103 have a relationship expressed by the formula: $H_2 = kd_1$ (wherein $0.5 < k < 5$, and $H_2 = 0.5$ μm or more), the top portion thickness $H_2$ of the base layer 103 can be made with a sufficient film thickness with respect to the base portion width $d_1$ of the convex portions 12. As a result, the surface 103a of the base layer 103 is planarized in a favorable manner, and at the same time, the base layer 103 with a reduced level of crystal defects, such as the dislocations remaining in the aggregated portion of group III nitride semiconductor crystals, and a favorable level of crystallinity can be formed on top of the convex portions 12.

In addition, by sequentially forming the n-type semiconductor layer 104, the light emitting layer 105, and the p-type semiconductor layer 106 that constitute the LED structure 20 on the surface 103a of the base layer 103 as mentioned above, each of these layers will be formed as a layer in which the occurrence of crystal defects such as dislocations or lattice mismatch is suppressed, and the crystallinity level is excellent.

Moreover, in the light emitting device 1 according to the present invention, by specifying the base portion width $d_1$ of the convex portions 12 of the substrate 101 and the top portion thickness $H_2$ of the base layer 103 so as to satisfy the above-mentioned relationship, the film thickness of the n-type semiconductor layer 104 formed on top of the base layer 103 so as to constitute the LED structure 20 can be secured with a sufficient film thickness without reducing the production efficiency.

The light emitting device 1 according to the present invention exhibits superior electric characteristics as well as high internal quantum efficiency and also excellent light emitting properties without causing generation of a leakage current or deteriorations in the ESD resistance by adopting the above-mentioned configuration.

[Electrode]

The positive electrode bonding pad 107 is provided on a portion of a translucent positive electrode 109 constituted of a translucent conductive oxide film layer which is in contact with the p-type semiconductor layer 106.

The translucent positive electrode 109 can be provided with use of a material containing at least one selected from ITO ($In_2O_3$—$SnO_2$), AZO (ZnO—$Al_2O_3$), IZO ($In_2O_3$—ZnO), and GZO (ZnO—$Ga_2O_3$) through a commonly used means which is well known in this technical field. In addition, also in terms of the structure of the translucent positive electrode 109, any structure may be used without any particular limitations, including any of the conventionally known structures. Further, the translucent positive electrode 109 may be formed so as to cover substantially all over the surface of the p-type semiconductor layer 106, or may be formed in a lattice shape or tree shape with gaps therein. Furthermore, after the formation of the translucent positive electrode 109, a thermal annealing process for the purpose of alloying or increasing transparency may be conducted or may not be conducted.

The positive electrode bonding pad 107 is provided for the electrical connection with a circuit board, a lead frame, or the like. As the positive electrode bonding pad, various structures using Au, Al, Ni, Cu, and the like are well known, and any of these known materials and structures may be employed without any limitations.

The thickness of the positive electrode bonding pad 107 is preferably within a range from 100 to 1,000 nm. In addition, in terms of the bonding pad properties, a larger thickness yields superior bondability, and therefore the thickness of the positive electrode bonding pad 107 is more preferably not less than 300 nm. Moreover, from the viewpoint of production costs, the thickness of the positive electrode bonding pad 107 is preferably not more than 500 nm.

The negative electrode bonding pad 108 is formed so as to come into contact with the n-type semiconductor layer 104 of the LED structure 20. For this reason, when the negative electrode bonding pad 108 is formed, the light emitting layer 105 and the p-type semiconductor layer 106 are partially removed to thereby expose the n-type contact layer of the n-type semiconductor layer 104, and the negative electrode bonding pad 108 is formed thereon.

As the negative electrode bonding pad 108, various compositions and structures are well known, and any of these well known compositions and structures can be used without any limitations and can be provided by a commonly used means which is well known in this technical field.

In the group III nitride semiconductor light emitting device 1 according to the present invention as described above, it is configured so that the substrate 101 includes the principal plane 10 constituted of the flat surface 11 configured from a (0001) C plane, and a plurality of convex portions 12 including a surface 12c non-parallel to the C plane, the convex portions have a base portion width $d_1$ of 0.05 to 1.5 μm and a height h of 0.05 to 1 μm, the base layer (group III nitride semiconductor layer) 103 formed by causing a group III nitride semiconductor to grow epitaxially on top of the principal plane 10 of the substrate 101 so as to cover the flat surface 11 and the convex portions 12, and the base portion width $d_1$ of the convex portions 12 and the top portion thickness $H_2$ of the base layer 103 at the positions of the top portions 12e of the convex portions 12 have a relationship expressed by the formula: $H_2 = kd_1$ (wherein 0.5<k<5, and $H_2 = 0.5$ μm or more). According to such a configuration, the surface 103a of the base layer 103 is planarized in a favorable manner and the dislocations are suppressed. As a result, each of the layers constituting the LED structure 20 formed on top of the base layer 103 becomes a layer in which dislocations are suppressed and the level of crystallinity is excellent. In addition, since the base portion width $d_1$ of the convex portions 12 is small and the surface 103a of the base layer 103 can be planarized rapidly, a group III nitride semiconductor light emitting device 1 exhibiting superior electric characteristics as well as high internal quantum efficiency and excellent light emitting properties without causing generation of a leakage current or deteriorations in the ESD resistance can be obtained with a high yield. Further, since the time for growing the base layer 103 can be shortened, a group III nitride semiconductor light emitting device 1 with high productivity can be obtained. Moreover, since the interface between the substrate 101 and the base layer 103 is configured as a small uneven shape, the level of light confinement within the light emitting device 1 can be reduced due to the diffuse reflection of light, thereby achieving a group III nitride semiconductor light emitting device 1 with superior light extraction efficiency.

[Method for Producing Group III Nitride Semiconductor Light Emitting Device]

A method for producing a group III nitride semiconductor light emitting device according to the present invention is a method for forming a single crystal base layer (group III nitride semiconductor layer) 103 on top of the substrate 101 and forming the LED structure 20 on top of the base layer 103, and is a method that includes: a substrate processing step in which, by forming a plurality of convex portions 12 having a base portion width $d_1$ of 0.05 to 1.5 μm and a height h of 0.05 to 1 μm on top of the flat surface 11 configured from a (0001) C plane of the substrate 101, the principal plane 10 constituted of the flat surface 11 and the convex portions 12 is formed on top of the substrate 101; an epitaxial step in which the base layer 103 is formed by causing the group III nitride semiconductor to grow epitaxially on top of the principal plane 10 of the substrate 101 so as to cover the flat surface 11 and the convex portions 12, and by configuring so that the base portion width $d_1$ of the convex portions 12 and the top portion thickness $H_2$ of the base layer 103 at the positions of the top portions 12e of the convex portions 12 have a relationship expressed by the formula: $H_2 = kd_1$ (wherein 0.5<k<5, and $H_2 = 0.5$ μm or more); and an LED lamination step in which the LED structure 20 is formed by causing the group III nitride semiconductor to grow epitaxially in succession to the epitaxial step.

Each of the steps included in the production method of the present invention will be described below in detail.

[Substrate Processing Step]

FIG. 2 is a diagram for explaining an example of a step for producing the laminated structure shown in FIG. 1, and it is a perspective view showing the substrate 101 prepared in the production method of the present embodiment. The substrate 101 includes the principal plane 10 constituted of the flat surface 11 configured from a C plane and a plurality of convex portions 12 formed on the C plane. In the substrate processing step of the present invention, the principal plane 10 having an uneven shape is formed by forming a plurality of convex portions 12 having a based width $d_1$ within a range of 0.05 to 1.5 μm and a height h within a range of 0.05 to 1 μm, on top of the flat surface 11 of the substrate 101.

An example of a method for processing the substrate 101 as shown in FIG. 2 will be described below.

In the substrate processing step, for example, by forming a plurality of convex portions 12 with surfaces that are not parallel to the C plane on top of a (0001) C plane of a sapphire substrate, the principal plane 10 constituted of the flat surface 11 configured from the C plane and the convex portions 12 is formed, thereby producing the substrate 101. Such a substrate processing step can be conducted by a method that includes, for example, a patterning step for forming a mask which defines the planar arrangement of the convex portions 12 on the substrate 101, and an etching step for etching the substrate 101 with use of the mask formed in the patterning step so as to form the convex portions 12.

In the present embodiment, as a substrate material for forming the plurality of convex portions 12 thereon, a single crystal sapphire wafer having a (0001) C plane as the surface thereof is employed. Here, the term "substrate having a (0001) C plane as the surface" may also include a substrate provided with an off angle within a range of ±3° in the plane direction of the substrate with respect to the (0001) direction. In addition, the term "surface which is not parallel to the C plane" means a surface which does not include a surface which is parallel to the (0001) C plane within a range of ±3°.

The patterning step can be performed by a general photolithography method. The base portion width $d_1$ of the base portion 12a of the convex portions 12 to be formed in the substrate processing step is preferably not more than 1.5 μm. Accordingly, in order to uniformly pattern all over the surface of the substrate 101, a stepper exposure method amongst various photolithography methods is preferably employed. However, in those cases where a pattern of convex portions 12 with a base portion width $d_1$ of not more than 1 μm is formed, an expensive stepper apparatus is required, which increases the cost. For this reason, when forming a mask pattern for convex portions with a width $d_1$ of not more than 1 μm, it is preferable to employ a laser exposure method, a nanoimprinting method or an electron beam (EB) exposure method used in the field of optical disks.

Examples of the etching methods for etching the substrate 101 in the etching step include a dry etching method and a wet etching method. However, when a wet etching is employed as the etching method, it is difficult to form the convex portions 12 with the surfaces 12c that are not parallel to the C plane since the crystal plane of the substrate 101 is exposed. For this reason, it is preferable to employ a dry etching method in the etching step.

The convex portions 12 with the surfaces 12c that are not parallel to the C plane can be formed by dry etching the substrate 101 until the mask formed in the patterning step mentioned above is eliminated. More specifically, for example, the convex portions 12 can be formed in the following manner. A resist is formed on the substrate 101 and then patterned into a predetermined shape, followed by postbaking in which a heat treatment at 110° C. for 30 minutes is performed in an oven or the like, so that the side surface of the resist is tapered. Subsequently, dry etching is conducted under a predetermined condition for promoting the etching in the transverse direction until the resist is eliminated.

In addition, the convex portions 12 with the surfaces 12c that are not parallel to the C plane can also be formed by employing a method in which the substrate is subjected to dry etching using a mask, followed by separation of the mask and an another round of dry etching of the substrate 101. More specifically, for example, the convex portions 12 can be formed in the following manner. A resist is formed on the substrate 101 and then patterned into a predetermined shape, followed by postbaking in which a heat treatment at 110° C. for 30 minutes is performed in an oven or the like, so that the side surface of the resist is tapered. Subsequently, dry etching is conducted under a predetermined condition for promoting the etching in the transverse direction, and the dry etching is interrupted before the resist is eliminated. Thereafter, the resist is separated and the dry etching is started again to perform etching until a predetermined level is achieved. The convex portions 12 formed by such a method exhibit excellent in-plane uniformity in terms of height.

Further, in those cases where a wet etching method is employed as the etching method, the convex portions 12 with the surfaces 12c that are not parallel to the C plane can be formed by combining with a dry etching method.

For example, when the substrate 101 is made of a sapphire single crystal, wet etching can be performed by using a mixed acid of phosphoric acid and sulfuric acid or the like at a high temperature of 250° C. or higher.

In terms of the method in which a wet etching method and a dry etching method are combined, the convex portions 12 can be formed, for example, by dry etching the substrate 101 until the mask is eliminated, followed by wet etching until a predetermined degree of etching is achieved using an acid of a high temperature. By forming the convex portions 12 by employing such a method, crystal planes are being exposed in the inclined planes constituting the side surfaces of the convex portions 12, and the inclined planes constituting the side surfaces of the convex portions 12 can be formed with angles with excellent reproducibility. In addition, a superior crystal plane can be exposed on the principal plane 10 with excellent reproducibility.

Further, in terms of the method in which a wet etching method and a dry etching method are combined other than the method described above, the convex portion 12 can also be formed by a method in which a mask made of an acid-resistant material such as $SiO_2$ is formed and subjected to wet etching, followed by separation of the mask, and dry etching under a predetermined condition for promoting the etching in the transverse direction. The convex portions 12 formed by such a method exhibit excellent in-plane uniformity in terms of height. Moreover, even when the convex portions 12 are formed by employing such a method, the inclined planes constituting the side surfaces of the convex portions 12 can be formed with angles with excellent reproducibility.

It should be noted that in the production method of the present embodiment, the method is described by providing an example for etching the substrate, in which an etching method is employed as a method for forming the convex portions. However, the present invention is not limited to the above methods. For example, as mentioned above, the convex portions can also be formed by depositing a material that constitutes the convex portions on top of the substrate, and these methods can be adopted, where appropriate.

[Buffer Layer Formation Step]

Next, in the buffer layer formation step, the buffer layer 102 as shown in FIG. 1 (also refer to FIG. 3) is laminated on top of the principal plane 10 of the substrate 101 prepared by the above-mentioned method.

In the example described in the present embodiment, by conducting the buffer layer formation step after the substrate processing step and before the epitaxial step, the buffer layer 102 as shown in FIG. 1 is laminated on top of the principal plane 10 of the substrate 101.

Further, in the present invention, since it is possible to adopt a configuration in which a buffer layer is omitted as mentioned above, the buffer layer formation step may not be conducted in such cases.

[Pretreatment of Substrate]

In the present embodiment, after introducing the substrate 101 in a chamber of a sputtering apparatus, it is desirable to subject the substrate 101 to a pretreatment employing a reverse sputtering method or the like through a plasma treatment prior to formation of the buffer layer 102 thereon. More specifically, the substrate surface can be cleaned by exposing the substrate 101 to an Ar or $N_2$ plasma. For example, through a reverse sputtering method in which the surface of the substrate 101 is treated with a plasma of Ar gas or $N_2$ gas or the like, any organic material or oxides adhered to the surface of the substrate 101 can be removed. In such a case, when a voltage is applied between the substrate 101 and the chamber, then the plasma particles will act efficiently on the substrate 101. By subjecting the substrate 101 to such a pretreatment, the buffer layer 102 can be formed all over the surface of the substrate 101, and the crystallinity of the film constituted of a group III nitride semiconductor further deposited thereon can be improved. In addition, it is more preferable to subject the substrate 101 to a wet pretreatment prior to the pretreatment by the reverse sputtering method as described above.

Further, it is preferable to conduct a pretreatment of the substrate 101 through a plasma treatment which is carried out in an atmosphere where ionic components such as $N^+$ and $(N_2)^+$ and radical components with no electric charge such as N radicals and $N_2$ radicals are mixed.

Note here that when, for example, ionic components or the like are solely supplied to the substrate surface during the removal of contaminants such as organic materials and oxides from the substrate surface, a problem arises in that the resulting energy will be too intensive and thereby damaging the substrate surface, as a result of which the quality of the crystals grown on the substrate will decline. In the present embodiment, it is possible to carry out the removal of contaminants and the like without causing damage to the surface of the substrate 101 by employing, as the pretreatment of the substrate 101, a plasma treatment conducted in an atmosphere where ionic components and radical components are mixed as described above, and thereby treating the substrate 101 with reactive species having an adequate energy level. It is considered that the mechanism capable of achieving such effects is due to the suppression of possible damages caused on the surface of the substrate 101 by the use of plasma having a low proportion of ionic components, the effective removal of contaminants by treating the surface of the substrate 101 with a plasma, or the like.

[Formation of Buffer Layer]

After subjecting the substrate 101 to a pretreatment, the buffer layer 102 having a composition of $Al_xGa_{1-x}N$ ($1 \geq x \geq 0$) is formed on top of the substrate 101 by a reactive sputtering method. In those cases where the buffer layer 102 having a single crystal structure is formed through a reactive sputtering method, the ratio of the nitrogen flow rate relative to the flow rate of the nitrogen raw material and the inert gas within the chamber of the sputtering apparatus is preferably controlled such that the nitrogen raw material represents at least 50% but no more than 100%, and more preferably about 75%.

Furthermore, in those cases where the buffer layer 102 having a columnar crystal (a polycrystal) structure is formed, the ratio of the nitrogen flow rate relative to the flow rate of the nitrogen raw material and the inert gas within the chamber of the sputtering apparatus is preferably controlled such that the nitrogen raw material represents at least 1% but no more than 50%, and more preferably about 25%.

The buffer layer 102 can be formed not only by the reactive sputtering method as mentioned above, but also by employing an MOCVD method. However, since the convex portions 12 are formed on the principal plane 10 of the substrate 101, the formation of the buffer layer by means of the MOCVD method may cause turbulence of the flow of the raw material gas on the principal plane 10. For this reason, it is difficult to uniformly laminate the buffer layer 102 on the principal plane 10 of the substrate 101 as in the present embodiment by employing an MOCVD method. In contrast to the MOCVD method, since the particles of raw materials are highly progressive in the reactive sputtering method, the buffer layer 102 can be laminated without being affected by the shape of the principal plane 10. Accordingly, it is preferable to form the buffer layer 102 by the reactive sputtering method.

[Epitaxial Step and LED Lamination Step]

Next, in the epitaxial step, after the above-mentioned buffer layer formation step, as shown in FIG. 1 (also refer to FIG. 3), an epitaxial step for epitaxially growing a single crystal group III nitride semiconductor on the buffer layer 102 formed on top of the principal plane 10 of the substrate 101, and thereby forming the base layer (group III nitride semiconductor layer) 103 so as to cover the principal plane 10 is conducted.

In addition, in the present invention, after forming the base layer 103 constituted of a group III nitride semiconductor in the epitaxial step, in the LED lamination step, the LED structure 20 constituted of each layers of the n-type semiconductor layer 104, the light emitting layer 105, and the p-type semiconductor layer 106 is formed on top of the base layer 103.

It should be noted that in the present embodiment, regarding the epitaxial step and the LED lamination step, each of which forms the respective layers using a group III nitride semiconductor, descriptions for the configuration common to both steps will be partially omitted at times.

In the present invention, there are no particular limitations on the method for growing gallium nitride based compound semiconductor (group III nitride semiconductor) when forming the base layer 103, the n-type semiconductor layer 104, the light emitting layer 105 and the p-type semiconductor layer 106, and all the methods that are known to grow a nitride semiconductor such as the reactive sputtering method, the metalorganic chemical vapor deposition (MOCVD) method, the hydride vapor phase epitaxy (HVPE) method, and the molecular beam epitaxy (MBE) method can be applied. Among these methods, in the MOCVD method, hydrogen ($H_2$) or nitrogen ($N_2$) can be used as the carrier gas, trimethyl gallium (TMG) or triethyl gallium (TEG) can be used as the Ga source that represents the group III raw material, trimethyl aluminum (TMA) or triethyl aluminum (TEA) can be used as the Al source, trimethyl indium (TMI) or triethyl indium (TEI) can be used as the In source, and ammonia ($NH_3$) or hydrazine ($N_2H_4$) can be used as the N source that represents the group V raw material.

In addition, in terms of dopant element n-type impurities, monosilane ($SiH_4$) or disilane ($Si_2H_6$) can be used as the Si raw material, and germane gas ($GeH_4$) or an organogermanium compound such as tetramethyl germanium (($CH_3$)$_4$Ge) or tetraethyl germanium (($C_2H_5$)$_4$Ge) can be used as the Ge raw material. In the MBE method, elemental germanium can also be used as a dopant source. In terms of dopant element p-type impurities, for example, biscyclopentadienyl magnesium ($Cp_2Mg$) or bisethylcyclopentadienyl magnesium ($EtCp_2Mg$) can be used as the Mg raw material.

In addition, the gallium nitride based compound semiconductor as described above can contain another group III element in addition to Al, Ga and In. Moreover, the gallium nitride based compound semiconductor can also contain dopant elements such as Ge, Si, Mg, Ca, Zn, and Be if necessary. Furthermore, the semiconductor may include not only elements that have been intentionally added, but also impurities that are unavoidably incorporated as a result of the film formation conditions employed, as well as the trace impurities contained in the raw materials and the reaction tube materials.

In the present invention, among the respective methods described above, it is preferable to employ an MOCVD method in view of obtaining a film with a favorable level of crystallinity. In the present embodiment, an example will be described, in which an MOCVD is employed in the epitaxial step and the LED lamination step.

[Epitaxial Step (Formation of Base Layer: Group III Nitride Semiconductor Layer)]

In the epitaxial step, as shown in FIG. 1, the base layer 103 is formed on top of the buffer layer 102, which has been formed on top of the substrate 101, by a conventionally known MOCVD method so as to cover the flat surface 11 and the convex portions 12 constituting the principal plane 10 of the substrate 101. In the epitaxial step of the present invention, the base layer 103 is formed so that the base portion width $d_1$ of the convex portions 12 formed on the substrate 101 in the above-mentioned substrate processing step and the top portion thickness $H_2$ of the base layer 103 at the positions of the top portions 12e of the convex portions 12 have a relationship expressed by the formula: $H_2 = kd_1$ (wherein $0.5 < k < 5$, and $H_2 = 0.5$ µm or more).

(Annealing Treatment)

In the present embodiment, it is not particularly necessary to conduct an annealing treatment on the buffer layer 102 prior to formation of the base layer 103. However, in those cases where formation of a group III nitride semiconductor is conducted using a vapor phase chemical deposition method such as an MOCVD method, MBE method or HYPE method, the substrate is generally subjected to a temperature raising step and a temperature stabilizing step that are conducted without accompanying the film formation. During these steps, a group V raw material gas is often passed through inside the chamber, and as a result, an annealing effect may be generated. In addition, a common carrier gas can be used as a carrier gas to pass through during the process without any limitations, and hydrogen, nitrogen or the like which is widely used in the vapor phase chemical deposition methods such as an MOCVD method may also be used. However, when hydrogen which is relatively chemically active is used as a carrier gas, the crystallinity or flatness of the crystal surface may be impaired. Therefore, it is preferable to shorten the time for the treatment.

(Film Formation Conditions)

The base layer 103 is formed using an MOCVD method in the production method of the present embodiment. However, there are no particular limitations on the method for laminating the base layer 103, and any methods can be used without any limitations as long as the method is a crystal growing method that is capable of looping the dislocations. In particular, the MOCVD method, the MBE method, or the VPE method is suitable because these methods can cause the migration, thereby enabling formation of a film exhibiting a favorable level of crystallinity. Of these methods, the MOCVD method is more preferable because a film exhibiting a particularly favorable level of crystallinity can be obtained.

Further, for example, when a single crystal, group III nitride semiconductor is grown on the principal plane of a sapphire substrate using the MOCVD method, there is a trend that a single crystal epitaxially grows from the C-plane, whereas no crystals epitaxially grow on the principal plane other than the C plane. That is, in the example described in the present embodiment, when the base layer 103 constituted of a single crystal, group III nitride semiconductor is to be epitaxially grown on top of the principal plane 10 of the substrate 101 where the buffer layer 102 has been formed, no crystal grows from the surfaces 12c of the convex portions 12 that are not parallel to the C plane, while a crystal oriented in the C-axis direction is epitaxially grown exclusively from the flat surface 11 configured from the (0001) C plane. As a result, since the base layer 103 formed on the principal plane 10 of the substrate 101 epitaxially grows on top of the principal plane 10 so as to cover the convex portions 12, generation of the crystal defects such as dislocations within the crystal does not occur, and thus a layer in which the crystallinity is favorably controlled can be formed.

In those cases where the base layer 103 is epitaxially grown on the principal plane 10 by the MOCVD method, it may become difficult at times to laminate a base layer 103 having excellent flatness on the substrate 101 where the convex portions 12 have been formed, as compared to a substrate in which no convex portion 12 has been formed. In addition, in the base layer 103 laminated on the principal plane 10 of the substrate 101 where the convex portions 12 have been formed, tilting in the C-axis direction, twisting in the C-axis direction or the like which deteriorate the crystallinity is likely to occur. For this reason, in those cases where the base layer 103 is epitaxially grown by the MOCVD method on the principal plane 10 of the substrate 101 where the convex portions 12 have been formed, it is desirable that the growth condition be set as follows so as to obtain sufficient surface flatness and excellent crystallinity.

In those cases where the base layer 103 is epitaxially grown by the MOCVD method on the principal plane 10 of the substrate 101 where the convex portions 12 have been formed, it is preferable that the growth pressure and the growth temperature be set at the conditions as described below. In general, a low growth pressure and a high growth temperature promote the crystal growth in the transverse direction, whereas a high growth pressure and a low growth temperature lead to a facet growth mode (a triangular shape). In addition, a high growth pressure at the initial growth stage tends to reduce the full width at half maximum of an X-ray rocking curve (XRC-FWHM) and improve the crystallinity.

Due to the above-mentioned reason, in those cases where the base layer 103 is epitaxially grown by the MOCVD method on the principal plane 10 of the substrate 101 where the convex portions 12 have been formed, it is preferable to change the growth pressure is preferably changed stepwise at two levels: for example, until the maximum thickness $H_1$ of the base layer 103 becomes about 2 μm or more (first half deposition); and until the maximum thickness $H_1$ subsequently becomes about 4.5 μm or more (second half deposition).

In addition, during the first half deposition, the growth pressure is preferably set at 40 kPa or higher, and more preferably at about 60 kPa. If the growth pressure is set at 40 kPa or higher, a facet growth mode (triangular shape) can be achieved and dislocations are bent in the transverse direction and do not penetrate through epitaxial surface.

For this reason, it is assumed that a high growth lowers the occurrence of dislocations and improve the crystallinity. On the other hand, a growth pressure of less than 40 kPa is undesirable since the crystallinity is deteriorated and the full width at half maximum of the X-ray rocking curve (XRC-FWHM) is increased.

However, if the growth pressure is set at 40 kPa or more, pits are easily generated in the surface of the base layer 103 which has been epitaxially grown, and thus a satisfactory level of surface flatness may not be achieved at times.

For this reason, if the growth pressure is set at 40 kPa or more, the growth temperature is preferably set at 1,140° C. or less, and more preferably at about 1,120° C. By setting the growth temperature at 1,140° C. or less, the generation of pits can be prevented satisfactorily even when the growth pressure is set at 40 kPa or more, preferably at about 60 kPa.

In addition, during the second half deposition, the growth pressure is preferably set at 40 kPa or less, and more preferably at about 20 kPa. By setting the growth pressure at 40 kPa or less in the second half deposition, the crystal growth in the transverse direction can be promoted, and a base layer 103 with excellent surface flatness can be obtained.

The temperature of the substrate 101 when forming the base layer 103, that is, the growth temperature of the base layer 103 is preferably 800° C. or more. This is because increasing the temperature of the substrate 101 during the film formation of the base layer 103 facilitates atom migration, thereby facilitating dislocation looping, and the temperature is more preferably 900° C. or more, and most preferably 1,000° C. or more. In addition, the temperature of the substrate 101 during formation of the base layer 103 must be lower than the temperature at which the crystals decompose, and is preferably less than 1,200° C. If the temperature of the substrate 101 is within the above-mentioned range during film formation of the base layer 103, a base layer 103 of excellent crystallinity can be obtained.

It should be noted that if necessary, the base layer 103 can be formed by doping an impurity, but an undoped layer is preferred in terms of improving crystallinity.

In addition, it is also possible to form the base layer 103 constituted of a group III nitride semiconductor using a reactive sputtering method. In those cases where a sputtering method is used, the apparatus for film formation can be made simpler, as compared to an MOCVD method, an MBE method or the like.

According to the epitaxial step as described above, the laminated structure shown in FIG. 1 can be obtained.

In the method for producing a group III nitride semiconductor light emitting device according to the present invention, since an epitaxial step for growing the base layer 103 on top of the principal plane 10 so as to cover the flat surface 11 and the convex portions 12 is included following the substrate processing step as described above, crystal defects such as dislocations hardly occur in the crystal of the base layer 103, and a base layer 103 in which the crystallinity is controlled in a favorable manner can be formed.

Here, for example, when a C plane is present on the surface of the convex portions, if a group III nitride semiconductor composed of a single crystal is grown epitaxially on a substrate where the convex portions have been formed, crystals will grow from both the C plane present on the surface of the convex portions and also from the C plane in an area where no convex portions are formed. In this case, generation of the crystal defects such as dislocations is likely to occur in a portion where the crystals grown from the surface of the convex portions and the crystals grown from the area, on which no convex portions are formed, are integrated, and thus it is difficult to obtain a group III nitride semiconductor with a favorable level of crystallinity. In those cases where an LED structure constituted of an n-type semiconductor layer, a light emitting layer, and a p-type semiconductor layer is formed on top of an underlying layer composed of a group III nitride semiconductor, the crystal defects generated in this process will be passed onto the crystals of semiconductor layers constituting the LED structure, which may cause a decline of internal quantum efficiency or an increase in the leakage current when forming a light emitting device.

On the other hand, in the present invention, as mentioned above, since the principal plane 10 constituted of the flat surface 11 configured from a C plane and the convex portions 12 is provided on the substrate 101 by forming the convex portions 12 with the surfaces 12c that are not parallel to the C plane on top of the substrate 101, crystals grow only from the flat surface 11 when the base layer 103 is grown epitaxially on the principal plane 10 of the substrate 101. Accordingly, the base layer 103 formed on the principal plane 10 of the substrate 101 grows epitaxially on top of the principal plane 61 so as to cover the convex portions 12, and thus no crystal defects such as dislocations occur within the crystal.

In addition, in the present invention, by forming the base layer 103 so as to satisfy a relationship expressed by the formula: $H_2$ {top portion thickness of the base layer 103}=$kd_1$ {base portion width of the convex portions 12 of the substrate 101} (wherein 0.5<k<5, and $H_2$=0.5 μm or more), it becomes possible to planarize the surface 103a of the base layer 103 in a favorable manner while improving the production efficiency.

[LED Lamination Step]

Subsequently, in the LED lamination step following the above-mentioned epitaxial step, as shown in FIG. 3, the LED structure 20 constituted of each of the n-type semiconductor layer 104, the light emitting layer 105 and the p-type semiconductor layer 106 can be laminated on top of the base layer 103, using a conventionally known MOCVD method.

(Formation of n-Type Semiconductor Layer)

The n-type semiconductor layer 104 is formed by sequentially laminating the n-type contact layer 104a and the n-type cladding layer 104b on top of the base layer 103 formed in the above-mentioned epitaxial step, using a conventionally known MOCVD method. In terms of the film formation apparatus for forming the n-type contact layer 104a and the n-type cladding layer 104b, it is possible to employ an MOCVD apparatus to be used for forming the above-mentioned base layer 103 or the light emitting layer described later by changing various conditions where appropriate. In addition, it is also possible to form the n-type contact layer 104a and the n-type cladding layer 104b by the reactive sputtering method.

In the present invention, it is preferable to adopt a method for starting formation of the n-type semiconductor layer 104 (n-type contact layer 104a) by forming the base layer 103 until the maximum thickness $H_1$ within a range of 1.5 to 4.5 μm is achieved in the above-mentioned epitaxial step, and then successively starting the doping of Si (n-type impurity) in the LED lamination step. By conducting the processes for forming the base layer 103 in a continuous manner from the epitaxial step to the LED lamination step as described above, and then starting the doping of Si at the above-mentioned timing through the alteration of raw material gas in the MOCVD apparatus, it becomes possible to form the n-type semiconductor layer 104 with high production efficiency, in which the flatness of the interface between the base layer 103 and the n-type contact layer 104a is improved and a sufficient film thickness is provided. As a result, the level of sheet resistance in the n-type semiconductor layer 104 is reduced, and thus a light emitting device 1 exhibiting excellent high voltage resistance characteristics such as the ESD resistance can be produced.

In addition, in the present invention, by forming the base layer 103 exhibiting superior flatness, reduced dislocations and high crystallinity through the above-mentioned procedures, and then successively forming the n-type semiconductor layer 104 (n-type contact layer 104a) which is doped with an n-type impurity, the n-type semiconductor layer 104 can be formed as a layer exhibiting excellent crystallinity. As a result, the crystallinity of the LED structure 20 as a whole improves, which is constituted by the sequential lamination of the light emitting layer 105 and the p-type semiconductor layer 106 on top of the n-type semiconductor layer 104, and thus a light emitting device 1 exhibiting excellent light emitting properties can be obtained.

In addition, as described above, in the LED lamination step of the present invention, it is preferable to form the n-type semiconductor layer 104 so that the total film thickness of the n-type contact layer 104a and the n-type cladding layer 104b combined is within a range from 2 to 4 μm. As described above, by securing a sufficient film thickness for the n-type semiconductor layer 104, the level of sheet resistance of for the n-type semiconductor layer 104 is lowered, the high voltage resistance characteristics such as the ESD resistance are improved, and the productivity when splitting into LED chips can be enhanced.

(Formation of Light Emitting Layer)

Subsequently, the light emitting layer 15 is formed on top of the n-type cladding layer 104b (n-type semiconductor layer 104) through a conventionally known MOCVD method. The light emitting layer 15 formed in the present embodiment as exemplified in FIG. 4 has a laminated structure starting with a GaN barrier layer and ending with another GaN barrier layer, and is formed by alternately laminating 7 layers of barrier layers 105a composed of GaN and 6 layers of well layers 105b composed of undoped $Ga_{0.8}In_{0.2}N$. In addition, in the production method of the present embodiment, the light emitting layer 105 can be formed by using the same film formation apparatus (MOCVD apparatus) as that used for forming the n-type semiconductor layer 104 described above.

(Formation of p-Type Semiconductor Layer)

Subsequently, the p-type semiconductor layer 106 constituted of the p-type cladding layer 106a and the p-type contact layer 106b is formed, using a conventionally known MOCVD method, on top of the light emitting layer 105, in other words, on top of the barrier layer 105a that is serving as the uppermost layer of the light emitting layer 105. The same MOCVD apparatus as that used for forming the n-type semiconductor layer 104 and the light emitting layer 105 can be used for forming the p-type semiconductor layer 106 while changing various film formation conditions where appropriate. In addition, it is also possible to form the p-type cladding layer 106a and the p-type contact layer 106b by employing the reactive sputtering method.

In the present embodiment, the p-type cladding layer 106a composed of Mg-doped $Al_{0.1}Ga_{0.9}N$ is first formed on top of the light emitting layer 105 (i.e., on top of the uppermost barrier layer 105a), and then the p-type contact layer 106b composed of Mg-doped $Al_{0.02}Ga_{0.98}N$ is formed thereon. In this process, the same MOCVD apparatus can be used for laminating the p-type cladding layer 106a and the p-type contact layer 106b. Note that as described above, not only Mg but also other elements, for example, Zn or the like can be used as p-type impurities in the same manner.

[Formation of Electrode]

Subsequently, with respect to the wafer on which the LED structure 20 has been formed in the LED lamination step, as shown in FIG. 3, the translucent positive electrode 109 is formed on top of the p-type semiconductor layer 106 at a predetermined position, followed by formation of the positive electrode bonding pad 107 on each of the translucent positive electrodes 109, as well as removal of the LED structure 20 at predetermined positions by etching. As a result, the n-type semiconductor layer 104 is exposed to form an exposed region 104c, and a negative electrode bonding pad 108 is formed in the exposed region 104c.

[Formation of Translucent Positive Electrode]

The translucent positive electrode 109 composed of ITO is first formed on top of the p-type contact layer 106b of the laminated semiconductor 10 that is constituted of the respective layers formed by the above-mentioned methods.

There are no particular limitations on the method for forming the translucent positive electrode 109 and the translucent positive electrode 109 can be formed through a conventional means well known in this technical field. In addition, also in terms of the structure thereof, any structure may be used without any particular limitations, including any of the conventionally known structures.

Moreover, as described above, the material used for the translucent positive electrode 109 is not limited to ITO and the translucent positive electrode 109 can be formed using other materials such as AZO, IZO, and GZO. Further, after forming the translucent positive electrode 109, a thermal annealing process for the purpose of alloying or increasing transparency may be conducted or may not be conducted.

[Formation of Positive Electrode Bonding Pad and Negative Electrode Bonding Pad]

Subsequently, the positive electrode bonding pad 107 is further formed on top of the translucent positive electrode 109 that is formed on top of the laminated semiconductor 10. This positive electrode bonding pad 107 can be formed, for example, by laminating each material, that is, Ti, Al, and Au, in this order starting from the surface side of the translucent positive electrode 109 using a conventionally known method.

In addition, when forming the negative electrode bonding pad 108, portions of the p-type semiconductor layer 106, the light emitting layer 105, and the n-type semiconductor layer 104 which are formed on top of the substrate 101 are first removed by a method such as a dry etching process to expose the n-type contact layer 104a and thereby forming the exposed region 104c. The negative electrode bonding pad 108 having a 4-layer structure, of which a detailed illustration is omitted, can be formed on this exposed region 104c, for example, by laminating each material, that is, Ni, Al, Ti, and Au, in this order starting from the surface side of the exposed region 104c using a conventionally known method.

In accordance with the method for producing a group III nitride semiconductor light emitting device according to the present invention as described above, since it is a method that includes: a substrate processing step in which, by forming a plurality of convex portions 12 having a base portion width $d_1$ of 0.05 to 1.5 μm and a height h of 0.05 to 1 μm on top of the flat surface 11 configured from a (0001) C plane of the substrate 101, the principal plane 10 constituted of the flat surface 11 and the convex portions 12 is formed on top of the substrate 101; an epitaxial step in which the base layer 103 is formed by causing the group III nitride semiconductor to grow epitaxially on top of the principal plane 10 of the substrate 101 so as to cover the flat surface 11 and the convex portions 12, and by configuring so that the base portion width $d_1$ of the convex portions 12 and the top portion thickness $H_2$ of the base layer (group III nitride semiconductor layer) 103 at the positions of the top portions 12e of the convex portions 12 have a relationship expressed by the formula: the formula: $H_2=kd_1$ (wherein $0.5<k<5$, and $H_2=0.5$ μm or more); and an LED lamination step in which the LED structure 20 is formed by causing the group III nitride semiconductor to grow epitaxially in succession to the epitaxial step, the surface 103a of the base layer 103 can be planarized in a favorable manner, and dislocations can be suppressed. As a result, each of the layers constituting the LED structure 20 can be formed on top of the base layer 103 in which dislocations are suppressed with excellent crystallinity. Further, since the base portion width $d_1$ of the convex portions 12 is small and the surface 103a of the base layer 103 can be planarized rapidly in the epitaxial step, a light emitting device 1 with an excellent high voltage breakdown resistance, such as the ESD resistance, can be obtained. Therefore, a group III nitride semiconductor light emitting device 1 exhibiting superior electric characteristics as well as high internal quantum efficiency and light extraction efficiency and also excellent light emitting properties without causing generation of a leakage current or deteriorations in the ESD resistance can be produced.

It should be noted that although an explanation is given by using a face up type, group III nitride semiconductor light emitting device in the present embodiment, the group III nitride semiconductor light emitting device of the present invention is not limited thereto, and a flip chip type, group III nitride semiconductor light emitting device can also be used.

[Lamp]

A lamp of the present invention uses a group III nitride semiconductor light emitting device of the present invention.

Examples of the lamp of the present invention include lamps formed using a combination of a group III nitride semiconductor light emitting device of the present invention and a phosphor. A lamp containing a combination of a group III nitride semiconductor light emitting device and a phosphor can be formed with a conventional configuration known to those skilled in the art, and can be produced using techniques known to those skilled in the art. Further, techniques for changing the light emission color by combining a group III nitride semiconductor light emitting device and a phosphor are also well known, and these types of techniques may be adopted within a lamp of the present invention without any particular limitations.

Figure 5:
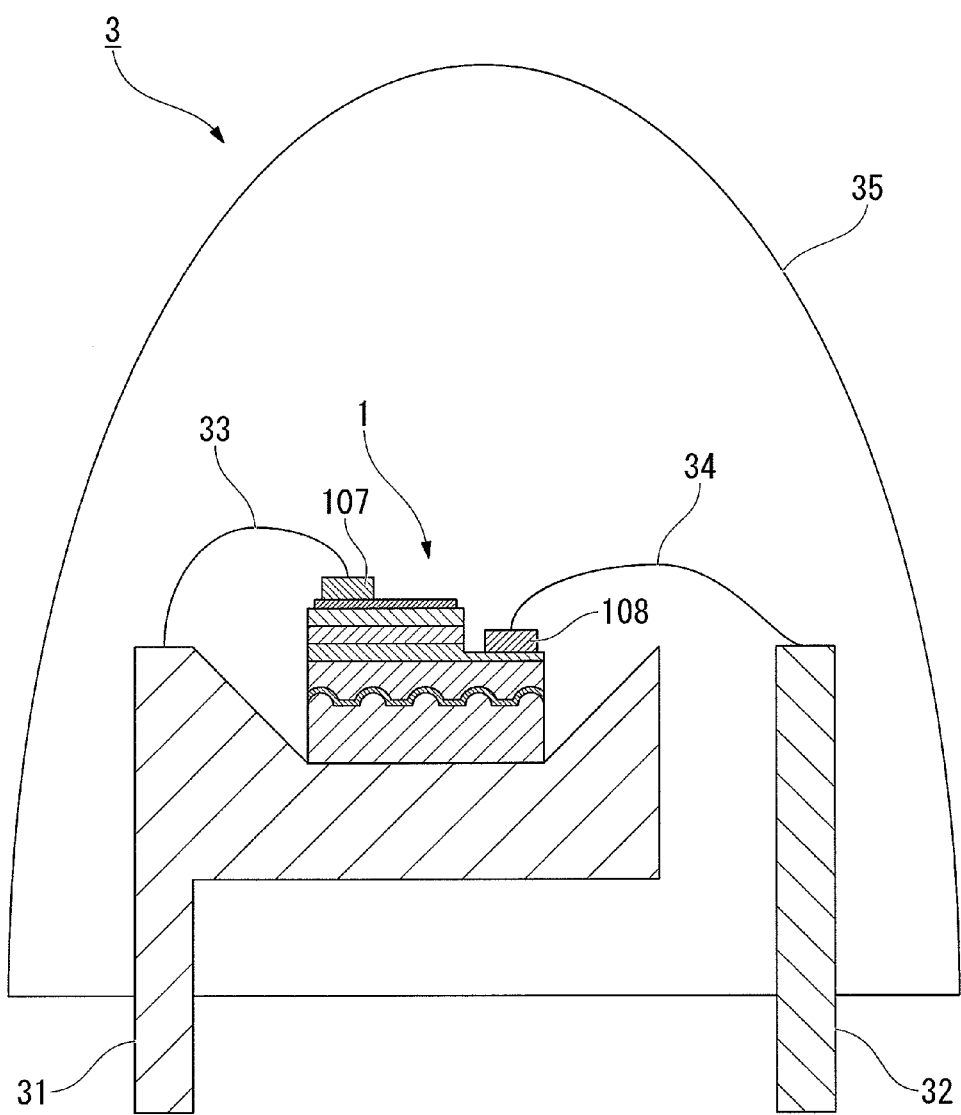
FIG. 5 is a diagram schematically describing an example of a lamp that is constituted by using a group III nitride semiconductor light emitting device according to the present invention.

FIG. 5 is a diagram schematically showing an example of a lamp that is constituted by using a group III nitride semiconductor light emitting device according to the present invention. The lamp 3 shown in FIG. 5 is a bullet-shaped lamp, and uses the group III nitride semiconductor light emitting device 1 shown in FIG. 3. As shown in FIG. 5, the group III nitride semiconductor light emitting device 1 is mounted by bonding the positive electrode bonding pad 107 of the group III nitride semiconductor light emitting device 1 to one of two frames 31 and 32 (the frame 31 in FIG. 5) using a wire 33, and bonding the negative electrode bonding pad 108 of the light emitting device 1 to the other frame 32 using a wire 34. In addition, the periphery around the group III nitride semiconductor light emitting device 1 is encapsulated within a mold 35 formed of a transparent resin.

The lamp of the present invention is prepared using the group III nitride semiconductor light emitting device 1 of the present invention, and therefore exhibits excellent light emitting properties.

Note that the lamp of the present invention can also be used within all manner of applications, including bullet-shaped lamps for general applications, side view lamps for portable backlight applications, and top view lamps used in display equipment.

In addition, the lamp prepared from the group III nitride semiconductor light emitting device of the present invention can be incorporated into various mechanical devices and equipment. For example, the lamp can be used for electronic equipment such as mobile phones, display equipment, various panels, computers, game machines, and illuminating apparatuses, and also devices, such as automobiles, which have incorporated such electronic equipment.

[Other Forms of Semiconductor Device]

The laminated structure of a group III nitride semiconductor obtained in the present embodiment and which has an excellent level of crystallinity (refer to the LED structure 20 in FIG. 4) can also be used for photoelectric conversion devices such as solar cells and light receiving elements, electronic devices such as heterojunction bipolar transistors (HBT) and high electron mobility transistors (HEMT), or the like, in addition to the semiconductor layer provided in the light emitting devices such as the light emitting diodes (LED) and laser diodes (LD) as described above. A multitude of these semiconductor devices with all manner of structures are already known, and any device structures including these known device structures can be adopted for a laminate structure of the group III nitride semiconductor according to the present invention without any particular limitations.

EXAMPLES

Next, the group III nitride semiconductor light emitting device according to the present invention will be described in more detail below using a series of examples and comparative examples, although the present invention is in no way limited by these examples.

Examples 1 to 3 and Comparative Examples 1 to 5

A plurality of convex portions having the "base portion width", "height", "(base portion width)/4", "interval between adjacent convex portions", and "presence/absence of C plane on the surface of convex portion" indicated in Table 1 were formed on top of the (0001) C plane of a sapphire substrate by the procedures shown below, thereby preparing the substrates of Examples 1 to 3 and Comparative Examples 1 to 4 with a sample number of n=5 (substrate processing step). That is, a mask was formed on the C plane sapphire substrate having a diameter of two inches by a known photolithography method, and the sapphire substrate was etched by a dry etching method to thereby form convex portions. Note that for the exposure method, a stepper exposure method using ultraviolet radiation was employed. In addition, a mixed gas of $BCl_3$ and $Cl_2$ was used for dry etching.

The convex portions of the substrates of Examples 1 to 3 and Comparative Examples 1 to 4 obtained in this manner were such that the planar shape of the base portion was circular with an outer shape that gradually reduced in size towards the top portions and side planes thereof had a bowl-like (hemispherical) shape that was curved towards the outside.

In addition, a sapphire substrate which had not been subjected to the substrate processing step as described above, and thus having a principal plane configured from a (0001) C plane with no convex portions was prepared as the substrate of Comparative Example 5.

Then, as will be described later, on the principal planes of the substrates of Examples 1 to 3 and Comparative Examples 1 to 4 where a plurality of convex portions had been formed, a buffer layer having a single crystal structure and composed of AlN was formed with a thickness of 50 nm using an RF sputtering method (buffer layer formation step). In this process, as a sputtering deposition apparatus, an apparatus having a high frequency power supply and also having a mechanism which was capable of moving the position of a magnet within a target was used.

In addition, by employing the same procedures, a buffer layer having a single crystal structure and composed of AlN was also formed with a thickness of 50 nm on top of the principal plane of the substrate of Comparative Example 5 with no convex portions.

First, the substrate where a plurality of convex portions had been formed was introduced into a chamber of the sputtering deposition apparatus and was heated to 500° C. After introducing only nitrogen gas into the chamber at a flow rate of 15 sccm, a high frequency bias of 500 W was applied to the substrate side to expose the substrate to a nitrogen plasma while keeping the pressure inside the chamber at 1 Pa, thereby washing the surface of the substrate (pretreatment).

Subsequently, argon gas and nitrogen gas were introduced into the chamber. Then, under conditions where the substrate temperature was kept at 500° C., a high frequency bias of 2,000 W was applied to the metal Al target side, the pressure inside the chamber was kept at 0.5 Pa, and the Ar gas was circulated at a flow rate of 5 sccm and the nitrogen gas was circulated at a flow rate of 15 sccm (the ratio of nitrogen gas to the total gas was 75%), a buffer layer composed of AlN was formed on top of the substrate where a plurality of convex portions had been formed. The growth rate was 0.08 nm/s. Note that the magnet within the target was set to swing during both the substrate cleaning operation and the buffer layer formation. Then, the film formation was carried out for a duration that had been determined in accordance with the previously measured film formation rate. Upon completion of

TABLE 1

| | Convex portions of substrate | | | | X-ray diffraction (XRD) of base layer | |
|---|---|---|---|---|---|---|
| | Base portion width (μm) | Height (μm) | (Base width portion)/4 (μm) | Interval between adjacent convex portions (μm) | (0002) plane (arcsec) | (10-10) plane (arcsec) |
| Ex. 1 | 1.0 | 1.0 | 0.25 | 1.8 | 30 | 150 |
| Ex. 2 | 1.0 | 1.0 | 0.25 | 1.8 | 50 | 180 |
| Ex. 3 | 1.0 | 1.0 | 0.25 | 1.8 | 30 | 150 |
| Comp. Ex. 1 | 2.0 | 1.0 | 0.50 | 2.0 | 50 | 150 |
| Comp. Ex. 2 | 2.0 | 1.0 | 0.50 | 2.0 | 40 | 120 |
| Comp. Ex. 3 | 2.0 | 1.0 | 0.50 | 2.0 | 50 | 130 |
| Comp. Ex. 4 | 1.6 | 1.0 | 0.38 | 1.8 | 30 | 140 |
| Comp. Ex. 5 | No convex portion | | | | 35 | 240 | the deposition of the buffer layer composed of an AlN layer with a thickness of 50 nm on top of the substrate where a plurality of convex portions had been formed, the plasma generation was stopped, and the substrate temperature was lowered.

A base layer composed of a group III nitride semiconductor was epitaxially grown on top of the buffer layer obtained as described above by employing a reduced pressure MOCVD method which will be described later (epitaxial step).

First, the substrate formed up to the buffer layer was taken out from the sputtering deposition apparatus, introduced into in a reaction furnace for the growth of the group III nitride semiconductor layer by the MOCVD method, and mounted on a susceptor made of high purity graphite for semiconductors to be heated to a deposition temperature by a radio frequency (RF) induction heating system. Thereafter, nitrogen gas was circulated in a vapor phase growth reaction furnace made of stainless steel for purging inside the reaction furnace.

Then, after circulating the nitrogen gas inside the vapor phase growth reaction furnace for 8 minutes, the induction heating system was activated to increase the temperature of the sapphire substrate from room temperature to 500° C. over a period of about 10 minutes. $NH_3$ gas and nitrogen gas were then circulated while keeping the temperature of the substrate at 500° C. The pressure inside the vapor phase growth reaction furnace was set to 95 kPa. Subsequently, the substrate temperature was increased to 1,000° C. over a period of about 10 minutes, and the substrate was then allowed to stand at these temperature and pressure for 10 minutes for thermal cleaning of the surface of the substrate. After completion of the thermal cleaning, supply of the nitrogen gas to the inside of the vapor phase growth reaction furnace was kept continued.

Thereafter, with the circulation of ammonia gas continued, the temperature of the substrate was increased to 1,120° C. in a hydrogen atmosphere, and the pressure inside the reaction furnace was adjusted to 60 kPa. Then, once it had been confirmed that the substrate temperature had stabilized at 1,120° C., supply of trimethyl gallium (TMG) to the vapor deposition reaction furnace was commenced, thereby epitaxially growing an undoped GaN layer on top of the AlN buffer layer. At that time, the top portion thickness $H_2$ of the base layer at the positions of the top portions of the convex portions provided on the substrate was configured into a thickness that satisfied a relationship, with the base portion width $d_1$ of the convex portions indicated in Table 1, expressed by the formula: $H_2=kd_1$ (wherein $0.5<k<5$, and $H_2=0.5$ μm or more). In addition, the amount of ammonia was adjusted so that the ratio of group V (N)/group III (Ga) was 600. Then, after growing a base layer having a thickness specified as described above and composed of GaN (group III nitride semiconductor), supply of the raw material to the reaction furnace was stopped, and the substrate temperature was lowered.

Thereafter, the substrate where the buffer layer and the base layer had been formed was taken out from the reaction furnace, and the full width at half maximum of the X-ray diffraction (XRD) was measured for the (10-10) and the (0002) plane of the base layer. Average values (n=5) in each of the Examples and Comparative Examples are indicate in the above Table 1.

As indicated in Table 1, the samples of Examples 1 to 3 where the base portion width $d_1$ of the convex portions and the top portion thickness $H_2$ of the base layer were within the range specified in the present invention, the full width at half maximum in the XRD of the (10-10) plane was within a range from 150 to 180 arcsec, and the full width at half maximum in the XRD of the (0002) plane was within a range from 30 to 50 arcsec, thereby revealing excellent crystallinity and flatness of the base layer.

On the other hand, the samples of Comparative Examples 1 to 4 where the base portion width $d_1$ of the convex portions did not fall within the range specified in the present invention, the full width at half maximum in the XRD of the (10-10) plane was within a range from 100 to 150 arcsec, and the full width at half maximum in the XRD of the (0002) plane was within a range from 30 to 50 arcsec.

In addition, also for the samples of Comparative Example 5 where a base layer is formed, via a buffer layer, on top of the principal plane of the substrate with no convex portions formed therein, the full width at half maximum in the XRD of the (10-10) plane was 240 arcsec, and the full width at half maximum in the XRD of the (0002) plane was 35 arcsec, thereby revealing inferior crystallinity and flatness of the base layer, as compared to those of the samples of Examples 1 to 3.

Examples 4 to 6 and Comparative Examples 6 to 10

Next, on top of the base layer constituted of a group III nitride semiconductor prepared by the same method as in the above-mentioned Examples 1 to 3 and Comparative Examples 1 to 5, the respective layers, namely, the n-type semiconductor layer, the light emitting layer, and the p-type semiconductor layer which constituted the LED structure were laminated in this order by the methods shown below, thereby preparing a light emitting device similar to that shown FIG. 3 (also refer to FIG. 4), and also preparing a lamp (light emitting diode: LED) that used the light emitting device similar to that shown in FIG. 5 (LED lamination step).

[Formation of n-Type Contact Layer]

Following the epitaxial step for forming the base layer 103, the same MOCVD apparatus was used to form the initial layer of an n-type contact layer 104a composed of GaN. In this process, by starting the doping of Si so as to coincide with the completion of formation of the base layer 103, the base layer 103 and the n-type contact layer 104a were formed in a continuous manner. With the exception of supplying $SiH_4$ as the Si dopant raw material, crystal growth of the n-type contact layer 104a was conducted under the same conditions as those used for the base layer.

Using the types of procedures described above, the surface of a substrate 101 formed of sapphire was subjected to reverse sputtering, a buffer layer 102 composed of MN having a single crystal structure was formed on top of the substrate 101, and an undoped GaN layer (the base layer 103) with a film thickness of 8 μm and a Si-doped GaN layer (the initial layer of the n-type contact layer 104a) with a film thickness of 2 μm and having a carrier concentration of $5\times10^{18}$ cm$^{-3}$ were then formed on the buffer layer 102.

Following film formation, the substrate taken out from the apparatus was colorless and transparent, and the surface of the GaN layer (the initial layer of the n-type contact layer 104a in this case) was a mirror-like surface.

[Formation of n-Type Cladding Layer]

Using an MOCVD method, an n-type cladding layer 104b was laminated on top of the n-type contact layer 104a formed using the procedure described above.

First, the substrate bearing the n-type contact layer 104a grown using the procedure described above was introduced into the same MOCVD apparatus, and with ammonia gas flowing through the apparatus and using nitrogen as a carrier gas, the substrate temperature was lowered to 760° C. While waiting for the temperature inside the furnace to adjust, the $SiH_4$ supply rate was set. The amount of $SiH_4$ to be circulated was calculated in advance, and was adjusted so as to yield an electron concentration within the Si-doped layer of $4\times10^{18}$ cm$^{-3}$. The supply of ammonia to the furnace was continued at the same flow rate.

Subsequently, with ammonia gas flowing through the chamber, SiH$_4$ gas and vapors of TMI and TEG generated by bubbling were supplied to the furnace, thereby forming a layer of Ga$_{0.99}$In$_{0.01}$N with a thickness of 1.7 nm, and a layer of GaN with a thickness of 1.7 nm. After repeating 19 cycles of this type of film formation treatment, a layer of Ga$_{0.99}$In$_{0.01}$N with a thickness of 1.7 nm was finally formed. Further, while this treatment was being conducted, the flow of SiH$_4$ was continued. This enabled the formation of an n-type cladding layer 104b constituted of a superlattice structure of Si-doped Ga$_{0.99}$In$_{0.01}$N and GaN.

[Formation of Light Emitting Layer]

Subsequently, using an MOCVD method, a light emitting layer 105 was laminated on top of the n-type cladding layer 104b formed using the procedure described above.

The light emitting layer 105 is constituted of a barrier layer 105a composed of GaN and a well layer 105b composed of Ga$_{0.8}$In$_{0.2}$N, and has a multiple quantum well structure. In order to form this light emitting layer 105, the barrier layer 105a was first formed on top of the n-type cladding layer 104c formed from a superlattice structure of Si-doped GaInN and GaN, and the well layer 105b composed of Ga$_{0.8}$In$_{0.2}$N was then formed on top of this barrier layer 105a. This type of lamination procedure was repeated six times, and a seventh barrier layer 105a was then formed on top of the sixth laminated well layer 105b, thereby forming a structure in which a barrier layer 105a was positioned at both sides of the light emitting layer 105 having a multiple quantum well structure.

First, with the substrate temperature held at 760° C., supply of TEG and SiH$_4$ to the inside of the furnace was commenced, an initial barrier layer formed of Si-doped GaN with a thickness of 0.8 nm was formed over a predetermined time period, and the supply of TEG and SiH$_4$ was then halted. Subsequently, the temperature of the susceptor was increased to 920° C. Supply of TEG and SiH$_4$ to the inside of the furnace was then restarted, and with the substrate temperature held at 920° C., an intermediate barrier layer with a thickness of 1.7 nm was deposited, and the supply of TEG and SiH$_4$ to the inside of the furnace was once again halted. Subsequently, the susceptor temperature was lowered to 760° C., supply of TEG and SiH$_4$ was again restarted, and following formation of a final barrier layer with a thickness of 3.5 nm, the supply of TEG and SiH$_4$ was once again halted, thereby completing formation of the GaN barrier layer. By using this type of 3-stage film formation process, a Si-doped GaN barrier layer (the barrier layer 105a) constituted of three layers; i.e., an initial barrier layer, an intermediate barrier layer and a final barrier layer was formed with a total film thickness of 6 nm. The amount of SiH$_4$ was adjusted to yield a Si concentration of $1\times10^{17}$ cm$^{-3}$.

Following formation of the barrier layer 105a, with the temperature of the substrate 101, pressure inside the furnace, and the flow rate and the types of carrier gas being unchanged, TEG and TMI were supplied to the inside of the furnace by switching the valves of TEG and TMI, thereby growing a well layer 105b composed of Ga$_{0.8}$In$_{0.2}$N. As a result, the well layer 105b with a film thickness of 2 nm was formed.

Following completion of the formation of the GaN barrier layer described above (the barrier layer 105a), TEG and TMI were supplied to the inside of the furnace, and film formation of a well layer was conducted, thereby forming a Ga$_{0.8}$In$_{0.2}$N layer with a film thickness of 2 nm (the well layer 105b).

Then, following completion of the formation of the well layer 105b composed of Ga$_{0.8}$In$_{0.2}$N, the setting for the TEG supply rate was altered. Subsequently, supply of TEG and SiH$_4$ was restarted, and a second barrier layer 105a was formed.

By repeating the above procedure six times, six barrier layers 105a composed of Si-doped GaN and six well layers 105b composed of Ga$_{0.8}$In$_{0.2}$N were formed.

Following formation of the sixth well layer 105b composed of Ga$_{0.8}$In$_{0.2}$N, a seventh barrier layer 105a was formed. In the formation process for this seventh barrier layer, the supply of SiH$_4$ was first halted, an initial barrier layer composed of undoped GaN was formed, the substrate temperature was then increased to 920° C. while the supply of TEG to the inside of the furnace was continued, an intermediate barrier layer was formed over a prescribed time period at a substrate temperature of 920° C., and the supply of TEG to the inside of the furnace was then halted. Subsequently, the substrate temperature was cooled to 760° C., the supply of TEG was restarted, and following formation of a final barrier layer, the supply of TEG was once again halted, thereby completing formation of the GaN barrier layer. By using this formation process, an undoped GaN barrier layer constituted of three layers, namely, the initial barrier layer, the intermediate barrier layer and the final barrier layer, was formed with a total film thickness of 4 nm (refer to the uppermost barrier layer 105a of the light emitting layer 105 shown in FIGS. 1 and 3).

By using the procedure outlined above, a light emitting layer 105 was formed with a multiple quantum well structure containing well layers of non-uniform thickness (equivalent to the first to fifth well layers 105b from the n-type semiconductor layer 104 side in FIG. 4) and a well layer having a uniform thickness (equivalent to the sixth well layer 105b from the n-type semiconductor layer 14 side in FIG. 4).

[Formation of p-Type Semiconductor Layer]

Following each of the processes described above, the same MOCVD apparatus was used to form a p-type cladding layer 106a having a superlattice structure constituted of four layers of undoped Al$_{0.06}$Ga$_{0.94}$N and three layers of Mg-doped GaN, and then a p-type contact layer 106b composed of a Mg-doped GaN with a film thickness of 200 nm, thereby completing the p-type semiconductor layer 106.

First, the substrate temperature was increased to 975° C. while supplying NH$_3$ gas, and the carrier gas was then switched from nitrogen to hydrogen at this temperature. Subsequently, the substrate temperature was increased to 1,050° C. TMG and TMAl were then supplied to the inside of the furnace, thereby forming a 2.5 nm layer composed of undoped Al$_{0.06}$Ga$_{0.94}$N. Subsequently, with no time interval allowed, the TMA valve was closed and a Cp$_2$Mg valve was opened, thereby forming a Mg-doped GaN layer with a thickness of 2.5 nm.

By repeating the above type of operation three times, and then forming an undoped Al$_{0.06}$Ga$_{0.94}$N layer finally, a p-type cladding layer 106a having a superlattice structure was formed.

Thereafter, only Cp$_2$Mg and TMG were supplied to the inside of the furnace, and a p-type contact layer 106b composed of p-type GaN with a thickness of 200 nm was formed. This p-type contact layer exhibited p-type conductivity even though an annealing treatment for activating the p-type carriers was not conducted.

The epitaxial wafer for an LED prepared in the manner described above has a laminated structure in which an AlN layer (the buffer layer 102) having a single crystal structure is first formed on top of a substrate 101 composed of sapphire having a C plane, and sequentially thereafter are formed, from the substrate 101 side, an undoped GaN layer (the base layer 103), an n-type contact layer 104a composed of a Si-doped GaN having an electron concentration of $5\times10^{18}$ cm$^{-3}$, a cladding layer (the n-type cladding layer 104b) having a Si concentration of $4\times10^{18}$ cm$^{-3}$ and having a superlattice structure constituted of 20 layers of 1.7 nm Ga$_{0.99}$In$_{0.01}$N and 19 layers of 1.7 nm GaN, a multiple quantum well structure (the light emitting layer 105) constituted of six Si-doped GaN barrier layers (the barrier layers 105a), six layers of undoped Ga$_{0.8}$In$_{0.2}$N well layers (the well layers 105b), and an uppermost barrier layer composed of undoped GaN (refer to the uppermost barrier layer 105a within the light emitting layer 105 shown in FIG. 4), and a p-type semiconductor layer 106 constituted of a p-type cladding layer 106a formed of four layers of undoped Al$_{0.06}$Ga$_{0.94}$N and three layers composed of Mg-doped GaN and having a superlattice structure, and a p-type contact layer 106b composed of Mg-doped GaN.

Then, following completion of the vapor phase growth of the p-type contact layer, the supply of electric current to the high frequency induction heater which had been used for heating the substrate was stopped immediately, and at the same time, the carrier gas was switched from hydrogen to nitrogen, and the flow rate of ammonia was reduced. More specifically, the amount of ammonia gas, which had accounted for about 14% of the total amount of circulated gas in terms of volume during the growth, was reduced to 0.2%.

The state was further retained for 45 seconds, after which the circulation of ammonia was stopped. In this state, upon confirmation that the substrate temperature was lowered to room temperature, the substrate having each of the layers laminated was taken out in the atmosphere.

In this manner, on top of the base layer prepared by the same method as in Examples 1 to 3 and Comparative Examples 1 to 5, the respective layers, namely, the n-type semiconductor layer, the light emitting layer, and the p-type semiconductor layer which constituted the LED structure were laminated in this order, thereby preparing samples of Examples 4 to 6 and Comparative Examples 6 to 10.

Subsequently, using the substrate obtained in this manner, on which the respective layers constituting the LED structure were formed, a light emitting diode (LED), which is one type of semiconductor light emitting device, was prepared by the procedures indicated below (refer to FIG. 3).

First, using a conventional photolithography technique, a translucent positive electrode composed of ITO was formed on top of the p-type contact layer of the substrate on which the respective layers constituting the LED structure were formed, and a positive electrode bonding pad having a structure in which Ti, Al and Au were laminated in this order was formed on top of this translucent positive electrode.

Subsequently, the substrate on which the positive electrode bonding pad was formed was subjected to dry etching to expose a region of the n-type semiconductor layer for forming the negative electrode bonding pad, and the negative electrode bonding pad was then formed constituted of four layers, namely Ni, Al, Ti and Au, onto this exposed n-type semiconductor layer.

The back surface of the substrate where the positive electrode bonding pad and the negative electrode bonding pad were formed was then ground or polished to form a mirror-like surface. Subsequently, the substrate was cut into square chips having a side length of 350 μm, thereby forming the LED chips.

The chip was then mounted on a lead frame so that the positive electrode bonding pad and the negative electrode bonding pad were facing upwards, and gold wiring was used to connect to the lead frame, thereby preparing a lamp (refer to FIG. 5).

When a forward current of 20 mA was caused to flow between the p-side and n-side electrodes of the thus prepared lamp, the forward voltage (drive voltage Vf) was measured, and the light emission output Po (mW) was also measured through the p-side translucent positive electrode. The average values thereof in the respective Examples and Comparative Examples are indicated in the following Table 2. In addition, regarding the electro-static discharge (ESD) resistance, a test was conducted using an ESD probe as testing equipment and in accordance with a human body model (HBM) in terms of various test conditions, and the number of samples in which the breakdown did not occur with respect to the total number of samples was indicated in the following Table 2 as the ESD residual ratio.

TABLE 2

| | Substrate used | Light emitting properties | | ESD residual ratio |
|---|---|---|---|---|
| | (Substrate formed up to base layer) | Drive voltage Vf (V) | Light emission output Po (mW) | (ESD resistance) (%) |
| Ex. 4 | Example 1 | 3.14 | 19.7 | 95.9 |
| Ex. 5 | Example 2 | 3.15 | 19.6 | 95.7 |
| Ex. 6 | Example 3 | 3.15 | 19.2 | 97.2 |
| Comp. Ex. 6 | Comparative Example 1 | 3.16 | 19.3 | 89.6 |
| Comp. Ex. 7 | Comparative Example 2 | 3.17 | 19.2 | 89.2 |
| Comp. Ex. 8 | Comparative Example 3 | 3.19 | 19.5 | 91.0 |
| Comp. Ex. 9 | Comparative Example 4 | 3.18 | 19.3 | 91.0 |
| Comp. Ex. 10 | Comparative Example 5 | 3.17 | 15.0 | — |

As shown in Table 2, the samples of Examples 4 to 6 prepared by the production method according to the present invention exhibited driving voltage Vf values of 3.14 to 3.15 V and light emission output Po values of 19.2 to 19.7 (mW).

On the other hand, the samples of Comparative Examples 6 to 9, in which the base layers were formed so that the base portion width $d_1$ of the convex portions of the substrate was 1.6 μm or 2 μm while satisfying a relationship expressed by the formula: $H_2$ {top portion thickness of the base layer 103}=$kd_1$ {base portion width of the convex portions 12 of the substrate 101} (wherein 0.5<k<5, and $H_2$=0.5 μm or more), exhibited driving voltage Vf values of about 3.16 to about 3.19 V and light emission output Po values of about 19.2 to about 19.5 mW, and thus somewhat higher driving voltages were required and the light emission output values were somewhat low, as compared to the samples of Examples 4 to 6.

In addition, the sample of Comparative Example 10 having a conventional constitution in which no convex portion was formed on the substrate exhibited a driving voltage Vf value of 3.17 V and also a light emission output Po value of 15.0 mW, indicating inferior light emitting properties compared to those of the samples of Examples 4 to 6.

Here, as shown in Table 2, when comparing the samples of Examples 4 to 6 with those of Comparative Examples 6 to 9, in terms of the driving voltage Vf and light emission output Po, there are no large differences although the samples of Examples 4 to 6 were somewhat superior. However, when comparing the ESD residual ratio, the samples of Examples 4 to 6 exhibited values of 95.7 to 97.2% whereas those of Comparative Examples 6 to 9 exhibited low residual ratios of 89.2 to 91.0%. From these results, it is apparent that the light emitting device of Examples 4 to 6, in which the base portion width $d_1$ of the convex portions provided on the substrate was adjusted within the range specified in the present invention, and also the base portion width $d_1$ of the convex portions 12 and the top portion thickness $H_2$ of the base layer 103 were adjusted so as to satisfy the relationship expressed by the formula: $H_2=kd_1$ (wherein $0.5<k<5$, and $H_2=0.5$ μm or more), exhibit superior high voltage breakdown resistance, such as the electro-static discharge (ESD) resistance.

Example 7

By using the group III nitride semiconductor light emitting devices produced in the above Examples 4 to 6, lamps (i.e., packages) each of which installing the aforementioned group III nitride semiconductor light emitting device were prepared in accordance with the method described in Japanese Unexamined Patent Application, First Publication No. 2007-194401. Furthermore, as an example of an electronic device or mechanical device, it was possible to prepare a back light which incorporated the lamp.

Experimental Example

The square chips of group III nitride semiconductor light emitting devices having a side length of 350 μm were prepared by the same method as that in the above Examples 4 to 6, and the samples of light emitting devices were prepared by mounting the positive electrode bonding pad and the negative electrode bonding pad on a lead frame so that they were facing upwards, and using gold wiring to connect to the lead frame. At this time, the samples having an interval between the convex portions of the substrate in the width direction of 1 μm were assigned to Experimental Example 1, and the samples having an interval between the convex portions of the substrate in the width direction of 2 μm were assigned to Experimental Example 2. Five samples were prepared for each Experimental Example.

Figure 6A:
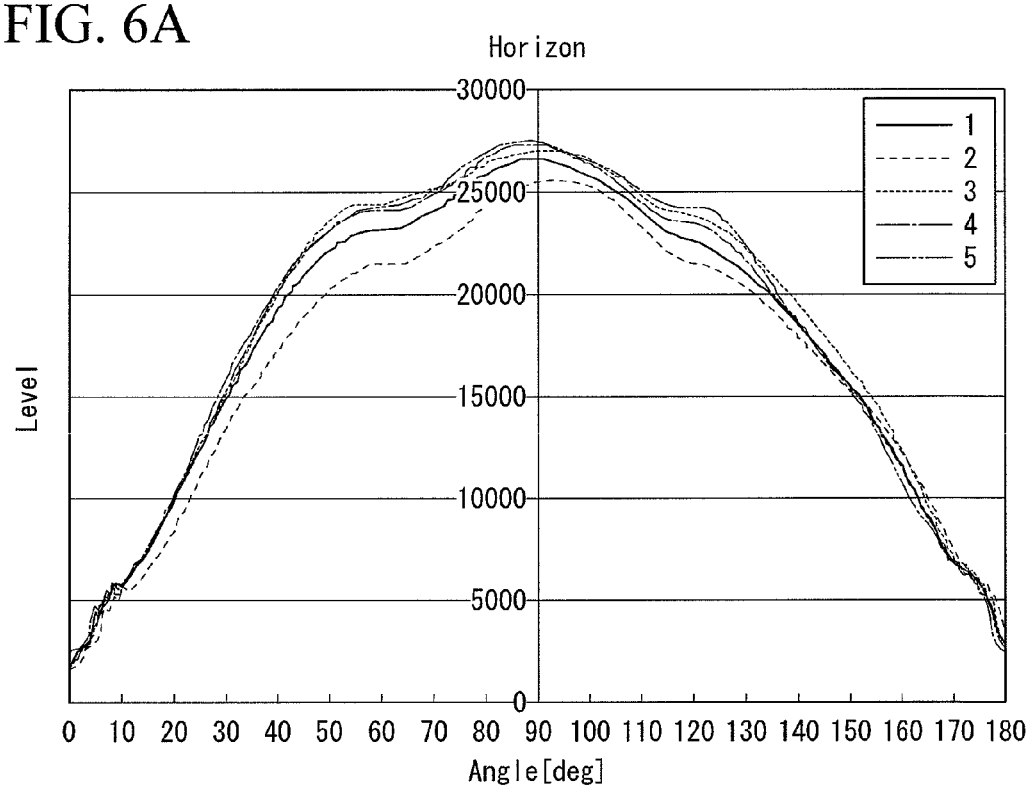
FIG. 6A is a diagram for explaining an Experimental Example of a group III nitride semiconductor light emitting device according to the present invention, and it is a graph showing the light emitting properties when the interval between the convex portions in the width direction which are formed on the substrate is 1 μm.
Figure 6B:
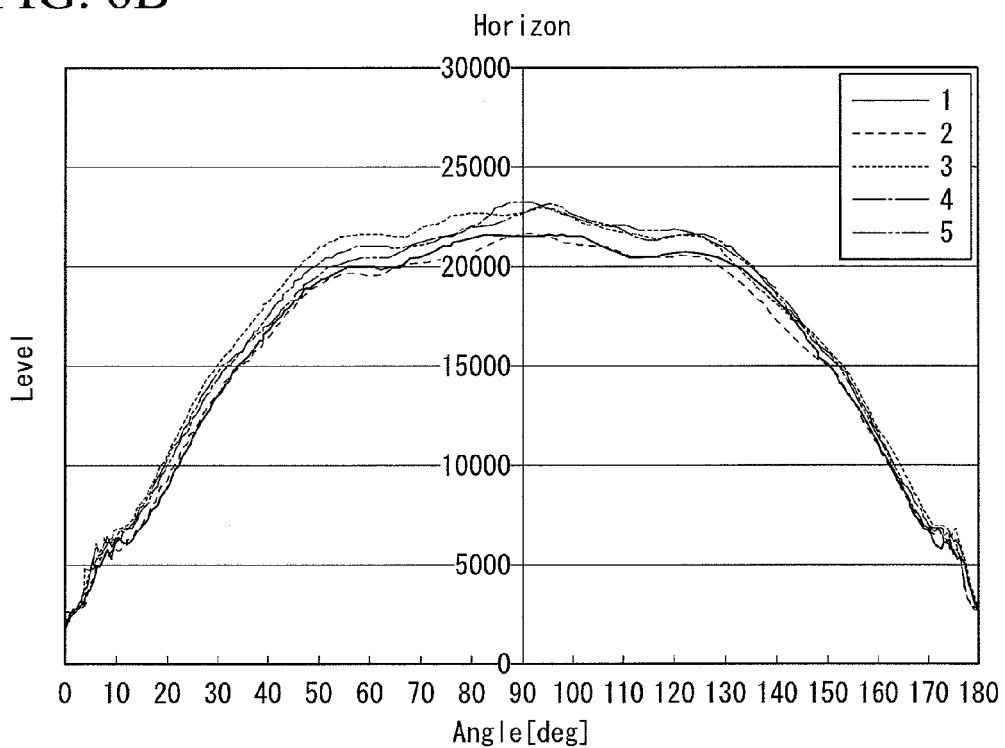
FIG. 6B is a diagram for explaining an Experimental Example of a group III nitride semiconductor light emitting device according to the present invention, and it is a graph showing the light emitting properties when the interval between the convex portions in the width direction which are formed on the substrate is 2 μm.

Then, the light emission intensity of each of these samples was measured by moving a detector in the vertical direction with respect to the upper face of the chip, and the measured results are shown in the graphs of FIG. 6A and FIG. 6B.

As shown in the graph of FIG. 6A, it is clear that the chip of light emitting device of Experimental Example 1 in which the interval between the convex portions formed on the substrate was 1 μm exhibited higher light emission output, as compared to the chip of light emitting device of Experimental Example 2 in which the interval between the convex portions formed on the substrate was 2 μm as shown in the graph of FIG. 6B. From this result, it became evident that smaller intervals between the convex portions formed on the substrate can improve the light emission output of the light emitting devices.

It is clear from the results of the respective Examples and Experimental Examples described above that the group III nitride semiconductor light emitting device of the present invention is excellent in terms of the internal quantum efficiency and light extraction efficiency, as well as the electric characteristics and production efficiency.

INDUSTRIAL APPLICABILITY

The present invention can be used for providing a group III nitride semiconductor light emitting device, which is excellent in terms of the internal quantum efficiency and light extraction efficiency, as well as the electric characteristics and production efficiency, and a production method thereof.

DESCRIPTION OF THE REFERENCE SYMBOLS

1: Group III nitride semiconductor light emitting device; 10: Principal plane; 11: Flat surface; 12: Convex portion; 12c: Surface; 12e: Top portion; 20: LED structure; 101: Substrate; 102: Buffer layer; 103: base layer (group III nitride semiconductor layer); 104: n-type semiconductor layer; 104b: n-type cladding layer; 105: Light emitting layer; 105b: Well layer; 106: p-type semiconductor layer; 106a: p-type cladding layer; 107: Positive electrode bonding pad; 108: Negative electrode bonding pad; 3: Lamp; $d_1$: base portion width (convex portion); $d_2$: Interval between convex portions; h: Height (convex portion); $H_2$: Top portion thickness (base layer).

The invention claimed is:
1. A group III nitride semiconductor light emitting device comprising:
a substrate; a single crystal, group III nitride semiconductor layer formed on top of the substrate;
an LED structure formed on top of the group III nitride semiconductor layer, and
a buffer layer constituted of polycrystal or single crystal $Al_xGa_{1-x}N$ ($0 \leq x \leq 1$) and having a thickness of 0.01 to 0.5 μm is laminated on top of the principal plane of the substrate by an Rf sputtering method using an a supply and a mechanism which is capable of moving the position of a magnet within a target,
wherein the substrate includes a principal plane constituted of a plurality of convex portions, the entire surface thereof being non-parallel to a (0001) C plane of the substrate, and a flat surface configured from the C plane,
the convex portions have a base portion width $d_1$ of 0.05 to 1.5 μm and a height h of 0.05 to 1 μm,
the group III nitride semiconductor layer is formed by causing a group III nitride semiconductor to grow epitaxially on top of the principal plane of the substrate so as to cover the buffer layer, the full width at half maximum of the X-ray diffraction (XRD) of the (10-10) plane of the group III nitride semiconductor layer ranges from 150 to 180 arcsec, and the full width at half maximum of the X-ray diffraction (XRD) of the (0002) plane of the group III nitride semiconductor layer ranges from 30 to 50 arcsec, and
the base portion width $d_1$ of the convex portions and the top portion thickness $H_2$ of the group III nitride semiconductor layer at the positions of the top portions of the convex portions have a relationship expressed by a formula: $H_2=kd_1$ (wherein $0.5<k<5$, and $H_2=0.5$ μm or more).

2. The group III nitride semiconductor light emitting device according to claim 1,
wherein the convex portions are configured so that the height h is at least as large as ¼ of the base portion width $d_1$, and
intervals $d_2$ between the convex portions adjacent to each other are 0.5 to 5 times as large as the base portion width $d_1$.

3. The group III nitride semiconductor light emitting device according to claim 1,
wherein the convex portions have a shape in which an outer shape thereof gradually reduces in size towards the top portion.

4. The group III nitride semiconductor light emitting device according to claim 1,
wherein the convex portions have either a substantially circular cone shape or a substantially polygonal pyramid shape.

5. The group III nitride semiconductor light emitting device according to claim 1,
wherein the convex portions are composed of either an oxide or a nitride which is provided on top of the C plane of the substrate.

6. The group III nitride semiconductor light emitting device according to claim 5, wherein the convex portions are composed of any one of $SiO_2$, $Al_2O_3$, SiN and ZnO.

7. The group III nitride semiconductor light emitting device according to claim 1, wherein the substrate is a sapphire substrate.

8. The group III nitride semiconductor light emitting device according to claim 1,
wherein the LED structure includes an n-type semiconductor layer, a light emitting layer and a p-type semiconductor layer in this order, each of which is constituted of a group III nitride semiconductor, on top of the principal plane of the substrate.

9. The group III nitride semiconductor light emitting device according to claim 8,
wherein the n-type semiconductor layer includes an n-type cladding layer, the p-type semiconductor layer includes a p-type cladding layer, and the n-type cladding layer and/or the p-type cladding layer includes at least a superlattice structure.

10. A lamp comprising the group III nitride semiconductor light emitting device of claim 1.

11. A method for producing a group III nitride semiconductor light emitting device that forms a single crystal, group III nitride semiconductor layer on top of a substrate and forms an LED structure on top of the group III nitride semiconductor layer, the method comprising:
a substrate processing step in which, by forming a plurality of convex portions, the entire surface thereof being non-parallel to a (0001) C plane of the substrate and having a base portion width $d_1$ of 0.05 to 1.5 μm and a height h of 0.05 to 1 μm and a flat surface configured from the C plane, a principal plane constituted of the convex portions and the flat surface is formed on a substrate;
a buffer layer forming step in which a buffer layer constituted of polycrystal or single crystal $Al_xGa_{1-x}N$ ($0 \leq x \leq 1$) and having a thickness of 0.01 to 0.5 μm is laminated on top of the principal plane of the substrate by an RF sputtering method using an apparatus having a high frequency power supply and a mechanism which is capable of moving the position of a magnet within a target,
an epitaxial step in which the group III nitride semiconductor layer is formed by causing the group III nitride semiconductor to grow epitaxially on top of the principal plane of the substrate so as to cover the buffer layer, and by configuring so that the base portion width $d_1$ of the convex portions and the top portion thickness $H_2$ of the group III nitride semiconductor layer at the positions of the top portions of the convex portions have a relationship expressed by a formula: $H_2 = kd_1$ (wherein $0.5 < k < 5$, and $H_2 = 0.5$ μm or more); and
an LED lamination step in which the LED structure is formed by causing the group III nitride semiconductor to grow epitaxially in succession to the epitaxial step.

12. The method for producing a group III nitride semiconductor light emitting device according to claim 11,
wherein the convex portions are formed in the substrate processing step so that a height h is at least as large as ¼ of the base portion width $d_1$, and
intervals $d_2$ between the convex portions adjacent to each other are 0.5 to 5 times as large as the base portion width $d_1$.

13. The method for producing a group III nitride semiconductor light emitting device according to claim 11,
wherein the convex portions are formed in the substrate processing step so as to have a shape in which an outer shape thereof gradually reduces in size towards the top portion.

14. The method for producing a group III nitride semiconductor light emitting device according to claim 11,
wherein the convex portions are formed in the substrate processing step so as to have either a substantially circular cone shape or a substantially polygonal pyramid shape.

15. The group III nitride semiconductor light emitting device according to claim 11, wherein the substrate is a sapphire substrate.

16. The method for producing a group III nitride semiconductor light emitting device according to claim 11,
wherein the convex portions are formed in the substrate processing step by forming a mask pattern on top of the (0001) C plane of the substrate using any one of a stepper exposure method, a nanoimprinting method, an electron beam (EB) exposure method, and a laser exposure method, followed by an etching of the substrate.

17. The method for producing a group III nitride semiconductor light emitting device according to claim 11,
wherein the convex portions are formed, on top of the (0001) C plane of the substrate, from either an oxide or a nitride.

18. The method for producing a group III nitride semiconductor light emitting device according to claim 17, wherein the convex portions are formed from any one of $SiO_2$, $Al_2O_3$, SiN and ZnO.

19. The method for producing a group III nitride semiconductor light emitting device according to claim 11,
wherein the LED structure is formed in the LED lamination step by laminating an n-type semiconductor layer, a light emitting layer and a p-type semiconductor layer in this order, each of which is constituted of a group III nitride semiconductor, on top of the principal plane of the substrate.

20. The method for producing a group III nitride semiconductor light emitting device according to claim 11,
wherein the group III nitride semiconductor layer is formed in the epitaxial step until a film thickness is achieved in which the top portion thickness $H_2$ of the group III nitride semiconductor layer satisfies a relationship, with the base portion width $d_1$ of the convex portions, expressed by a formula: $H_2 = kd_1$ (wherein $0.5 < k < 5$, and $H_2 = 0.5$ μm or more), and an n-type semiconductor layer is then formed successively in the LED lamination step by starting a doping of an n-type impurity.

21. The method for producing a group III nitride conductor light emitting device according to claim 19, wherein in the LED lamination step, the n-type semiconductor layer is formed as a layer that includes an n-type cladding layer, the p-type semiconductor layer is formed as a layer that includes a p-type cladding layer, and the n-type cladding layer and/or the p-type cladding layer is formed as a layer that includes at least a superlattice structure.

22. A group III nitride semiconductor light emitting device obtained by the production method of claim 11.

* * * * *